(12) United States Patent
Hsieh et al.

(10) Patent No.: US 12,176,297 B2
(45) Date of Patent: *Dec. 24, 2024

(54) SEMICONDUCTOR DEVICE PACKAGE

(71) Applicant: Advanced Semiconductor Engineering, Inc., Kaohsiung (TW)

(72) Inventors: Hao-Chih Hsieh, Kaohsiung (TW); Tzu-Cheng Lin, Kaohsiung (TW); Chun-Jen Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 248 days.

This patent is subject to a terminal disclaimer.

(21) Appl. No.: 17/719,281

(22) Filed: Apr. 12, 2022

(65) Prior Publication Data

US 2022/0238457 A1    Jul. 28, 2022

Related U.S. Application Data

(63) Continuation of application No. 16/791,946, filed on Feb. 14, 2020, now Pat. No. 11,302,646.

(51) Int. Cl.
*H01L 23/552* (2006.01)
*H01L 23/00* (2006.01)
(Continued)

(52) U.S. Cl.
CPC .......... *H01L 23/552* (2013.01); *H01L 23/481* (2013.01); *H01L 23/5385* (2013.01)

(58) Field of Classification Search
CPC . H01L 23/552; H01L 23/481; H01L 23/5385; H01L 24/73; H01L 24/16; H01L 24/24; H01L 24/48; H01L 2224/16225; H01L 2224/16227; H01L 2224/24225; H01L 2224/48091; H01L 2224/48465; H01L 2224/73227; H01L 2224/73257;
(Continued)

(56) References Cited

U.S. PATENT DOCUMENTS 9,105,613 B1    8/2015  Chen et al.
9,583,446 B2    2/2017  Pagaila et al.
(Continued)

OTHER PUBLICATIONS

Final Office Action U.S. Appl. No. 16/791,946, issued Sep. 10, 2021, 24 pages.
Non-Final Office Action for U.S. Appl. No. 16/791,946, issued May 6, 2021, 23 pages.
Notice of Allowance for U.S. Appl. No. 16/791,946, issued Dec. 8, 2021, 11 pages.

*Primary Examiner* — Herve-Louis Y Assouman
(74) *Attorney, Agent, or Firm* — FOLEY & LARDNER LLP

(57) ABSTRACT

A semiconductor device package includes a first substrate, a second substrate, a first electronic component, a second electronic component and a shielding layer. The second substrate is disposed over the first substrate. The first electronic component is disposed between the first substrate and the second substrate. The second electronic component is disposed between the first substrate and the second substrate and adjacent to the second substrate than the first electronic component. The shielding element electrically connects the second electronic component to the second substrate. The second electronic component and the shielding element define a space accommodating the first electronic component.

17 Claims, 25 Drawing Sheets

(51) Int. Cl.
*H01L 23/48* (2006.01)
*H01L 23/538* (2006.01)
*H01L 25/065* (2023.01)

(58) Field of Classification Search
CPC ....... H01L 2224/73265; H01L 25/0652; H01L 25/16; H01L 2224/48227; H01L 2225/0651; H01L 2225/06517; H01L 2225/06537; H01L 2225/06572; H01L 2924/00014; H01L 2924/12041; H01L 2924/1461; H01L 2924/181; H01L 2924/1815; H01L 2924/18161; H01L 2924/19041; H01L 2924/19042; H01L 2924/19043; H01L 2924/19105; H01L 2924/19106; H01L 2924/3025; H01L 25/071; H01L 23/3128; H01L 23/60; H01L 25/50
See application file for complete search history.

(56) References Cited

U.S. PATENT DOCUMENTS

| | | | |
|---|---|---|---|
| 9,915,869 | B1 | 3/2018 | Hisamura |
| 10,388,637 | B2 | 8/2019 | Kim et al. |
| 11,302,646 | B2 * | 4/2022 | Hsieh .................. H01L 25/0652 |
| 2006/0261472 | A1 | 11/2006 | Kimura et al. |
| 2011/0090659 | A1 | 4/2011 | Liao et al. |
| 2012/0062439 | A1 | 3/2012 | Liao et al. |
| 2013/0105939 | A1 | 5/2013 | Domae |
| 2016/0240493 | A1 | 8/2016 | Lee et al. |
| 2016/0379933 | A1 | 12/2016 | Scanlan et al. |
| 2018/0061809 | A1 * | 3/2018 | Chiu .................. H01L 23/49541 |
| 2018/0190601 | A1 | 7/2018 | Hitomi et al. |
| 2018/0301420 | A1 | 10/2018 | Kim et al. |
| 2019/0088621 | A1 * | 3/2019 | Yang .................. H01L 23/5385 |

* cited by examiner

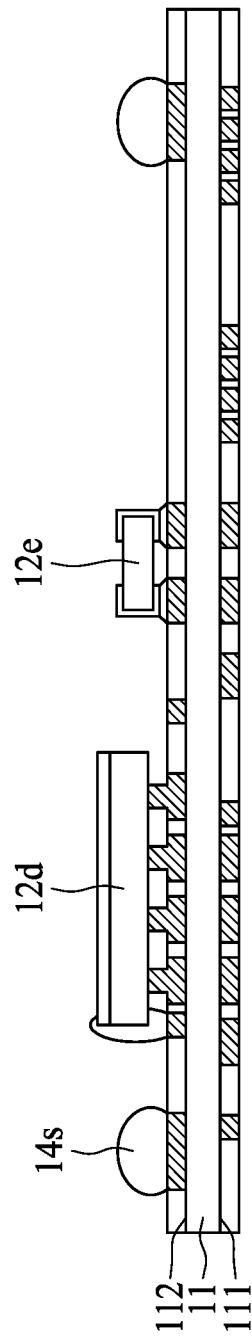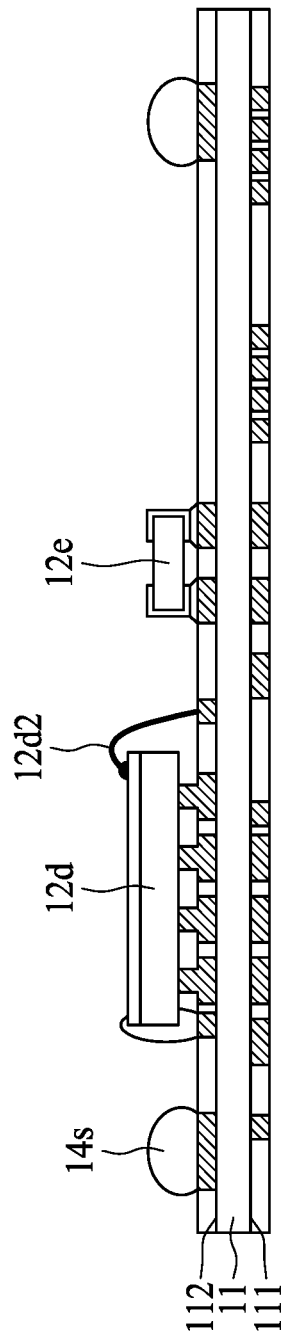

SEMICONDUCTOR DEVICE PACKAGE

CROSS-REFERENCE TO RELATED APPLICATION

This application is a continuation of U.S. patent application Ser. No. 16/791,946 filed Feb. 14, 2020, the contents of which is incorporated herein by reference in its entirety.

BACKGROUND

1. Field of the Disclosure

The present disclosure relates to a semiconductor device package having an interposer, and a method of manufacturing the same.

2. Description of Related Art

As the requirement of the performance and the functionality of a semiconductor device package increases, more electronic components are integrated within a single semiconductor device package. In order to increase package density and to reduce the area of the semiconductor device package, a dual-side assembly may be employed. That is, the electronic components may be mounted on both surfaces of a substrate or a carrier. As the number of the electronic components increases, it is desirable to further reduce the size of the semiconductor device package.

SUMMARY

According to some embodiments of the present disclosure, a semiconductor device package includes a first substrate, a second substrate, a first electronic component, a second electronic component and a shielding layer. The second substrate is disposed over the first substrate. The first electronic component is disposed between the first substrate and the second substrate. The second electronic component is disposed between the first substrate and the second substrate and adjacent to the second substrate than the first electronic component. The shielding element electrically connects the second electronic component to the second substrate. The second electronic component and the shielding element define a space accommodating the first electronic component.

According to some embodiments of the present disclosure, a semiconductor device package includes a first substrate, and a second substrate and a third substrate. The second substrate is disposed over the first substrate. The third substrate is disposed over the first substrate and side by side with the second substrate. The first substrate and the second substrate define a first bonding region. The first substrate and the third substrate define a second bonding region. A height of the first bonding region is different from a height of the second bonding region.

According to some embodiments of the present disclosure, a semiconductor device package includes a first substrate, a first electronic component, an optical device, a compartment shield and a first encapsulant. The first substrate has a first surface and a second surface opposite to the first surface. The first electronic component is disposed on the first surface of the first substrate. The optical device is disposed on the first surface of the first substrate. The optical device includes a receiving region adjacent to the first electronic component. The compartment shield is disposed between the first electronic component and the receiving region. The first encapsulant encapsulates the first electronic component and between the first electronic component and the receiving region.

In order to further understanding of the present disclosure, the following embodiments are provided along with illustrations to facilitate appreciation of the present disclosure; however, the appended drawings are merely provided for reference and illustration, and do not limit the scope of the present disclosure.

BRIEF DESCRIPTION OF THE DRAWINGS

FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, FIG. 10M and FIG. 10N illustrate a semiconductor manufacturing method in accordance with some embodiments of the present disclosure.

DETAILED DESCRIPTION

The aforementioned illustrations and following detailed descriptions are examples for the purpose of explaining the present disclosure.

Figure 1A:
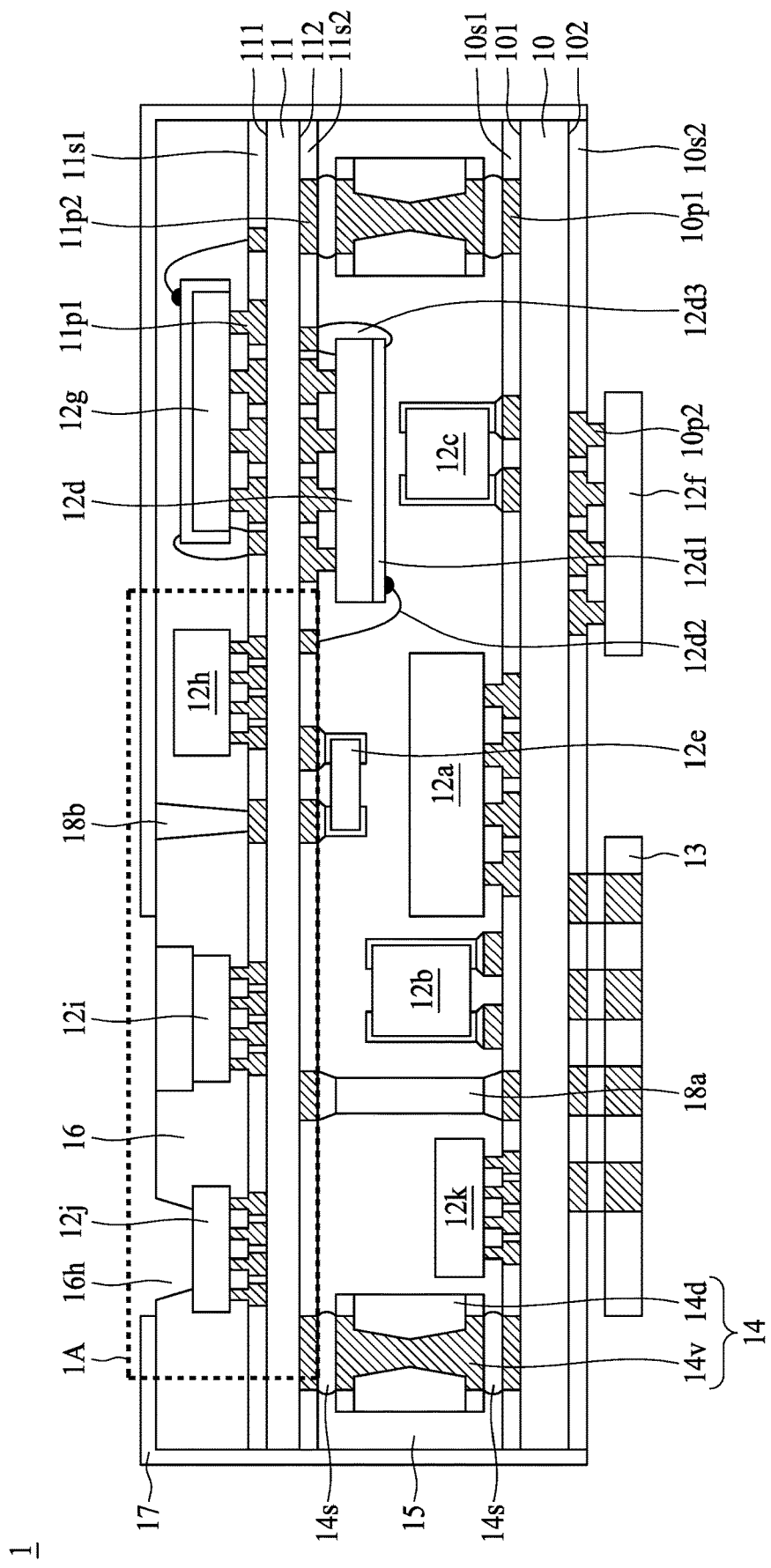
FIG. 1A is a cross-sectional view of a semiconductor device package in accordance with an embodiment of the present disclosure.

FIG. 1A illustrates a cross-sectional view of a semiconductor device package 1 in accordance with some embodiments of the present disclosure. The semiconductor device package 1 includes substrates 10, 11, electronic components 12a, 12b, 12c, 12d, 12e, 12f, 12g, 12h, 12i, 12j, 12k, a connector module 13, an interposer 14, package bodies 15, 16 and a shielding layer 17.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element. In some embodiments, the substrate 10 may be a single-layer substrate or multi-layer substrate which includes a core layer and a conductive material and/or structure disposed on a surface 101 (also can be referred to as a top surface or a first surface) and a surface 102 (also can be referred to as a bottom surface or a second surface) of the substrate 10. The conductive material and/or structure may include a plurality of traces. The substrate 10 may include one or more conductive pads $10p1$ in proximity to, adjacent to, or embedded in and exposed at the surface 101 of the substrate 10. The substrate 10 may include one or more conductive pads $10p2$ in proximity to, adjacent to, or embedded in and exposed at the surface 102 of the substrate 10. The substrate 10 may include solder resists $10s1$ and $10s2$ (or solder mask) respectively on the surfaces 101 and 102 of the substrate 10 to fully expose or to expose at least a portion of the conductive pads $10p1$ and $10p2$ for electrical connections.

The substrate 11 is disposed over the surface 101 of the substrate 10. In some embodiments, the substrate 11 and the substrate 10 may include the same material. Alternatively, the substrate 11 and the substrate 10 may include different materials. The substrate 11 may include one or more conductive pads $11p1$ in proximity to, adjacent to, or embedded in and exposed at a surface 111 of the substrate 11. The substrate 11 may include one or more conductive pads $11p2$ in proximity to, adjacent to, or embedded in and exposed at a surface 112 of the substrate 11. The substrate 11 may include solder resists $11s1$ and $11s2$ (or solder mask) respectively on the surfaces 111 and 112 of the substrate 11 to fully expose or to expose at least a portion of the conductive pads $11p1$ and $11p2$ for electrical connections.

The interposer 14 is disposed between the substrates 10 and 11, and electrically connected to the substrates 10 and 11. The interposer 14 may include a dielectric layer $14d$ and at least one via $14v$ penetrating the dielectric layer $14d$ for electrical connection. The exposed portions of the via $14v$ may be electrically connected to the substrate 10 (e.g., to the conductive pad $10p1$) and the substrate 11 (e.g., to the conductive pad $11p2$) through solder balls $14s$. In some embodiments, there may be any number of the interposers 14 depending on different design specifications. The interposers 14 may be disposed in or near the periphery or any other locations of the substrate 10 or 11.

The electronic components 12a, 12b, 12c and 12k are disposed on the surface 101 of the substrate 10 and electrically connected to the substrate 10 (e.g., to the conductive pads $10p1$). The electronic components 12a, 12b, 12c and 12k may include active electrical components and/or passive electrical components. For example, the electronic components 12a, 12k may be chips or dice including a semiconductor substrate, one or more integrated circuit devices and one or more overlying interconnection structures therein. For example, the electronic components 12b, 12c may be passive electrical components, such as capacitors, resistors or inductors. Each electronic components 12a, 12b, 12c and 12k may be electrically connected to one or more of another electronic components 12a, 12b, 12c and 12k and to the substrate 10 (e.g., to the RDL), and electrical connection may be attained by way of flip-chip or wire-bond techniques.

In some embodiments, a compartment shield 18a is disposed between the substrates 10 and 11, and electrically connected to the substrates 10 and 11. The compartment shield may be disposed between two electronic components (e.g., the electronic components 12b and 12k) to prevent interference (e.g., cross-talk issue, electromagnetic interference issue or the like) therebetween. In some embodiments, the compartment shield 18 may include, for example, aluminum (Al), copper (Cu), chromium (Cr), tin (Sn), gold (Au), silver (Ag), nickel (Ni) or stainless steel, or a mixture, an alloy, or other combination thereof.

The electronic components $12f$ and the connector module 13 are disposed on the surface 102 of the substrate 10 and electrically connected to the substrate 10 (e.g., to the conductive pads $10p2$). The electronic component $12f$ may include an active electrical component or a passive electrical component. For example, the electronic component $12f$ may be a chip or a die including a semiconductor substrate, one or more integrated circuit devices and one or more overlying interconnection structures therein. The electronic component $12f$ may be electrically connected to the substrate 10 (e.g., to the RDL), and electrical connection may be attained by way of flip-chip or wire-bond techniques. In some embodiments, the connector module 13 may provide electrical connections between the semiconductor device package 1 and external devices or a circuit board. For example, the electrical connections may be achieved by a Bus, a Universal Serial Bus (USB) (e.g., Type-A, Type-B or Type-C), a high definition multimedia interface (HDMI) or any other data transmission mechanisms.

The electronic components $12d$ and $12e$ are disposed on the surface 112 of the substrate 11 and electrically connected to the substrate 11 (e.g., to the conductive pads $11p2$). The electronic components $12d$ and $12e$ may include active electrical components and/or passive electrical components. For example, the electronic component $12d$ may be a chip or a die including a semiconductor substrate, one or more integrated circuit devices and one or more overlying interconnection structures therein. For example, the electronic component $12e$ may be a passive electrical component, such as a capacitor, a resistor or an inductor. Each electronic components $12d$ and $12e$ may be electrically connected to one or more of another electronic components $12d$ and $12e$ and to the substrate 11 (e.g., to the RDL), and electrical connection may be attained by way of flip-chip or wire-bond techniques.

In some embodiments, a shielding layer $12d1$ (or a shielding element) is disposed on a backside surface of the electronic component $12d$ to provide an electromagnetic interference (EMI) shielding for the electronic component $12d$. The shielding layer $12d1$ is electrically to the substrate 11 (e.g., to the ground) through a bonding wire $12d2$ and/or a conductive adhesive $12d3$. The electronic component $12d$ and the electronic component $12c$ are at least partially overlapping in a direction perpendicular to the surface 101 of the substrate 10. For example, a projection of the electronic component $12d$ on the surface 101 of the substrate 10 and a projection of the electronic component $12c$ on the surface 101 of the substrate 10 are at least partially overlapping. In some embodiments, the electronic component $12c$ may extend within a space defined by the shielding layer $12d1$, the bonding wire $12d2$ and the conductive adhesive 12d3. For example, a portion of the electronic component 12c and a portion of the bonding wire 12d2 are overlapping in a direction parallel to the surface 101 of the substrate 10. By using the space defined by the shielding layer 12d1, the bonding wire 12d2 and the conductive adhesive 12d3 to accommodate a portion of the electronic component 12c, the area of the semiconductor device package 1 can be reduced.

The package body 15 is disposed between the substrates 10 and 11 to cover or encapsulate the interposer 14, the compartment shield 18a and the electronic components 12a, 12b, 12c, 12d, 12e and 12k. In some embodiments, the package body 15 includes an epoxy resin having fillers, a molding compound (e.g., an epoxy molding compound or other molding compound), a polyimide, a phenolic compound or material, a material with a silicone dispersed therein, or a combination thereof.

The electronic components 12g, 12h, 12i and 12j are disposed on the surface 111 of the substrate 11 and electrically connected to the substrate 11 (e.g., to the conductive pads 11p1). The electronic components 12g, 12h, 12i and 12j may include active electrical components and/or passive electrical components. For example, the electronic components 12g and 12h may be chips or dice including a semiconductor substrate, one or more integrated circuit devices and one or more overlying interconnection structures therein. In some embodiments, the electronic component 12g is similar to the electronic component 12d. For example, the electronic component 12g also includes a shielding layer connected to ground of the substrate 11. The electronic component 12h may be a passive electrical component, such as a capacitor, a resistor or an inductor. In some embodiments, the electronic components 12h and 12i are electronic components that require the shielding capability. For example, the electronic component 12h may be a radio frequency (RF) device. For example, the electronic component 12i may be an optical device.

Figure 1B:
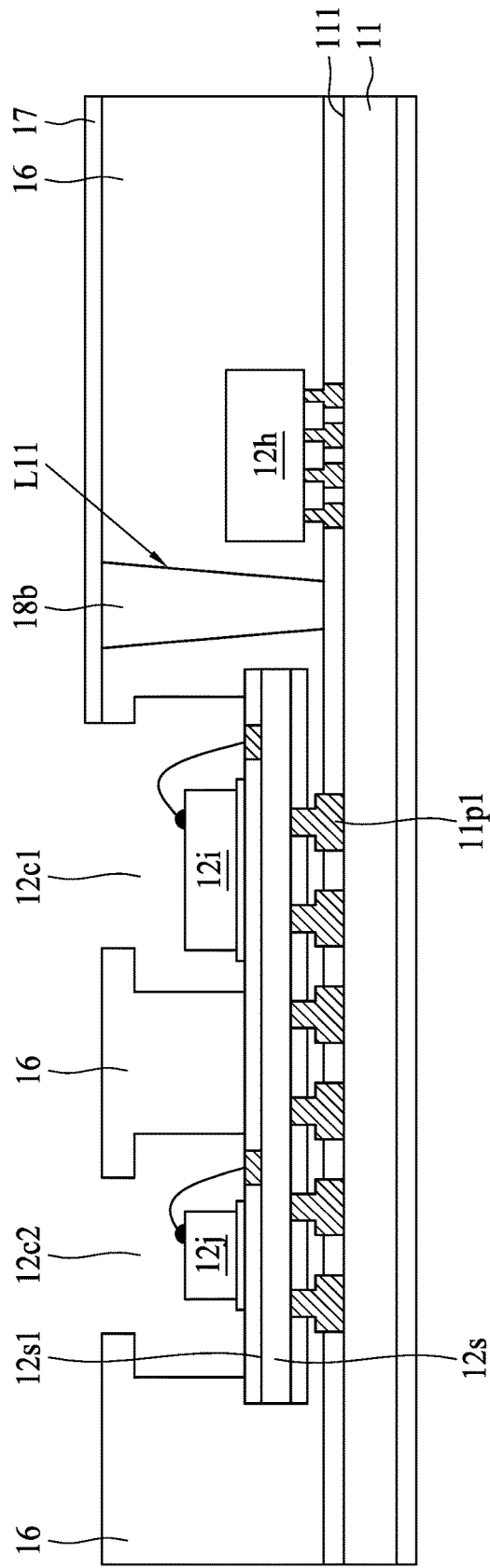
FIG. 1B illustrates an enlarged view of a portion of the semiconductor device package 1 as shown in FIG. 1A, in accordance with some embodiments of the present disclosure.
Figure 1C:
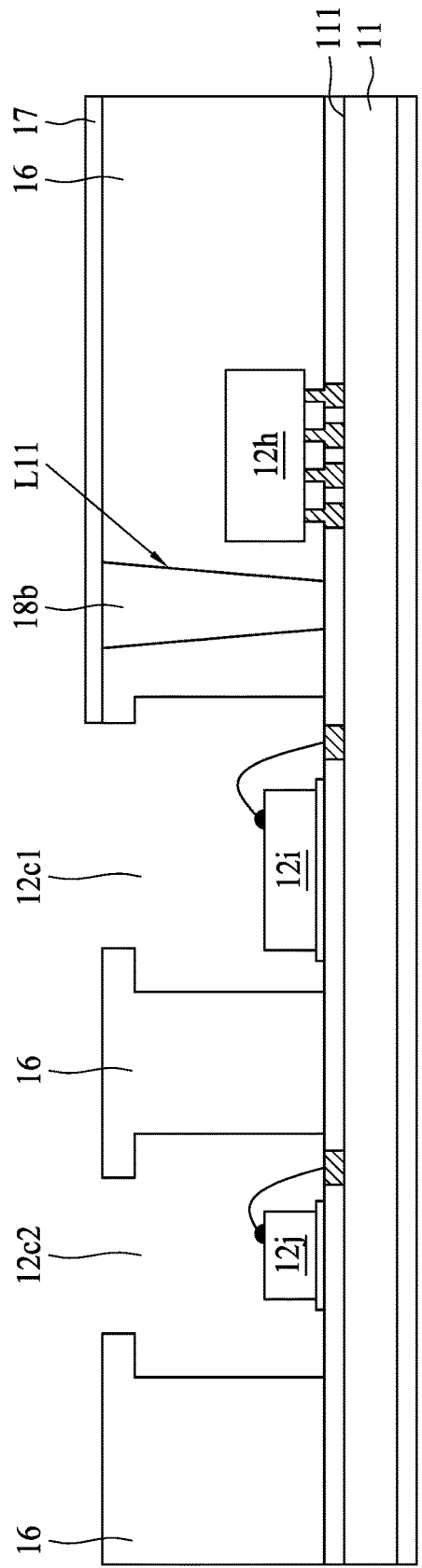
FIG. 1C illustrates an enlarged view of a portion of the semiconductor device package 1 as shown in FIG. 1A, in accordance with some embodiments of the present disclosure.

As shown in FIG. 1B, which illustrates an enlarged view of a portion of the semiconductor device package 1 encircled by a dotted-line rectangle 1A as shown in FIG. 1A, in accordance with some embodiments of the present disclosure, the electronic components 12i and 12j are disposed on a surface 12s1 of a substrate 12s, and the substrate 12s is disposed on the surface 111 of the substrate 11. In some embodiments, the substrate 12s may be omitted, and the electronic components 12i and 12j are directly disposed on the surface 111 of the substrate 11 as shown in FIG. 1C. The electronic components 12i and 12j are spaced apart or separated by the package body 16.

In some embodiments, the electronic component 12i may include a light detector which is, for example, a PIN diode (a diode including a p-type semiconductor region, an intrinsic semiconductor region, and an n-type semiconductor region) or a photo-diode or a photo-transistor. The electronic component 12i can be connected to the substrate 12s, for example, by way of flip-chip or wire-bond techniques. The electronic component 12i has an active surface (or light detecting surface) facing away from the substrate 12s. The electronic component 12j may include an emitting die or other optical die. For example, the electronic component 12j may include a light-emitting diode (LED), a laser diode, or another device that may include one or more semiconductor layers. The semiconductor layers may include silicon, silicon carbide, gallium nitride, or any other semiconductor materials. The electronic component 12j can be connected to the substrate 12s, for example, by way of flip-chip or wire-bond techniques. The electronic component 12j has an active surface (or light emitting surface) facing away from the substrate 12s. The package body 17 defines cavities 12c1 and 12c2 to respectively accommodate the electronic components 12i and 12j. For example, the electronic components 12i and 12j are exposed from the package body 17.

A compartment shield 18b is disposed between the electronic component 12h and the electronic component 12i. In some embodiments, the compartment shield 18b may be electrically connected to ground of the substrate 11. In some embodiments, the compartment shield 18b may be electrically connected to the shielding layer 17. Hence, the compartment shield 18b can be grounded through the substrate 11 and/or through the shielding layer 17. The compartment shield 18 can provide interference (e.g., cross-talk issue, electromagnetic interference issue or the like) shielding for the electronic component 12h. For example, the compartment shield can prevent interference between the electronic component 12h and other electronic components. In addition, the compartment shield 18b and the shielding layer 17 may prevent undesired light from entering the light detecting surface of the electronic component 12i (e.g., through the path L11 as shown in FIG. 1B). By using a single compartment shield 18b to provide shielding capability for both electronic components 12h and 12i, the area and the cost for manufacturing the semiconductor device package 1 can be reduced. In some embodiments, the compartment shield 18b and the compartment shield 18a may include the same material. Alternatively, the compartment shield 18b and the compartment shield 18a are formed of different materials.

Referring to FIG. 1A, the package body 16 is disposed on the surface 111 of the substrate 11 and covers the electronic components 12g, 12h, 12i, 12j and the compartment shield 18b. In some embodiments, the electronic components 12i, 12j and a portion (e.g., a top surface) of the compartment shield 18b are exposed from the package body 16. In some embodiments, the package body 16 includes an epoxy resin having fillers, a molding compound (e.g., an epoxy molding compound or other molding compound), a polyimide, a phenolic compound or material, a material with a silicone dispersed therein, or a combination thereof.

The shielding layer 17 is disposed on an external surface of the package bodies 15, 16 and covers the package bodies 15, 16 and the substrates 10, 11. The shielding layer 17 is electrically connected to the grounding element of the substrate 10 and/or 11. The shielding layer 17 is electrically connected to the compartment shield 18b. In some embodiments, the shielding layer 17 is a conformal shield. The shielding layer 17 is substantially aligned with the surface 102 of the substrate 10. In some embodiments, the shielding layer 17 is a conductive thin film, and may include, for example, Al, Cu, Cr, Sn, Au, Ag, Ni or stainless steel, or a mixture, an alloy, or other combination thereof. The shielding layer 17 may include a single conductive layer or multiple conductive layers.

Figure 2:
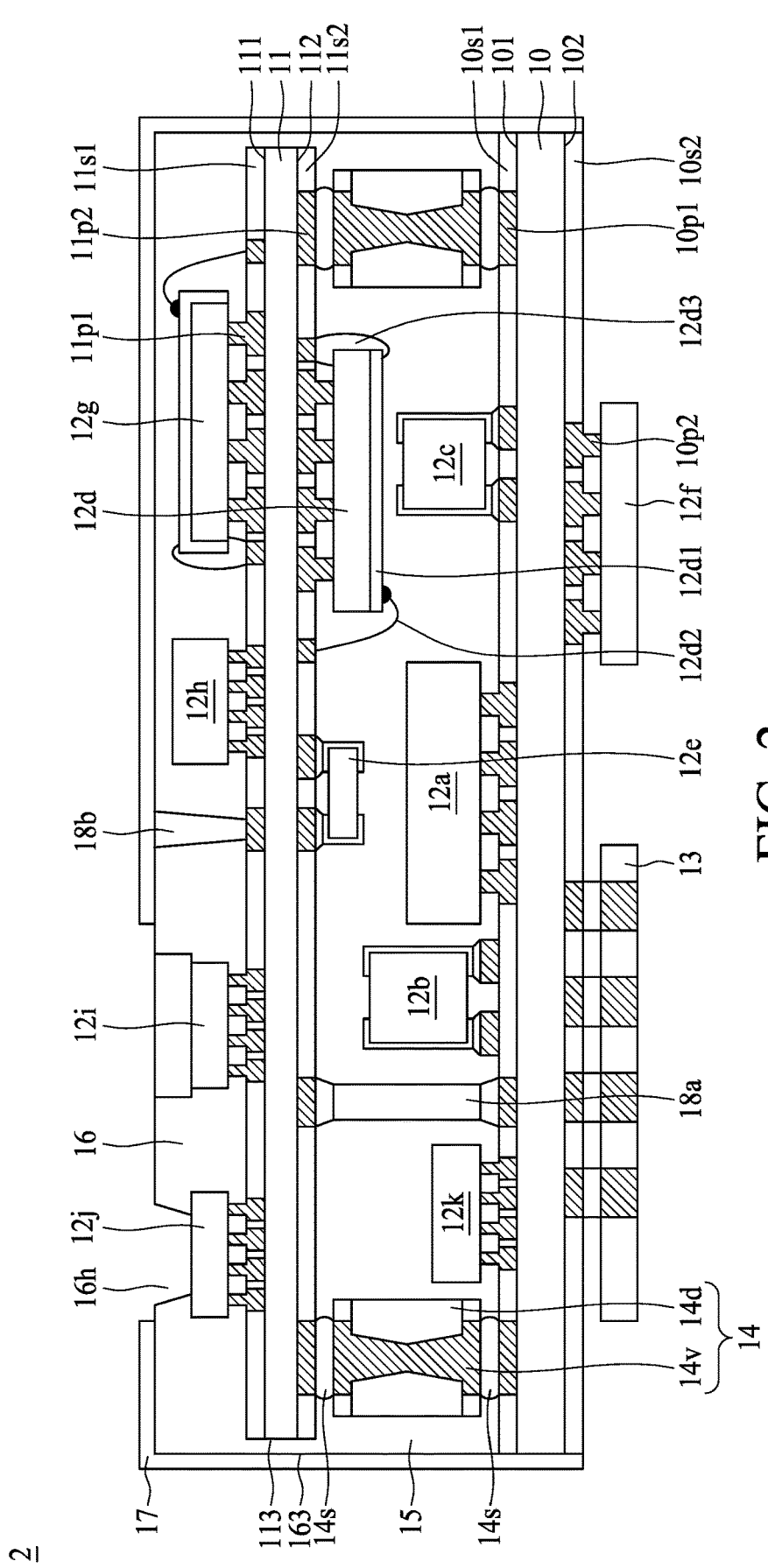
FIG. 2 is a cross-sectional view of a semiconductor device package in accordance with an embodiment of the present disclosure.

FIG. 2 illustrates a cross-sectional view of a semiconductor device package 2 in accordance with some embodiments of the present disclosure. The semiconductor device package 2 is similar to the semiconductor device package 1 as shown in FIG. 1A, and the differences therebetween are described below.

A lateral surface 113 of the substrate 11 is recessed from a lateral surface 163 of the package body 16. For example, the lateral surface 113 of the substrate 11 and the lateral surface 163 of the package body 16 are non-coplanar. For example, there is a gap between the lateral surface 113 of the substrate 11 and the lateral surface 163 of the package body 16. For example, the lateral surface 113 of the substrate 11 is covered by the package body 16. For example, a width of the substrate 11 is less than is width of the substrate 10.

Figure 3:
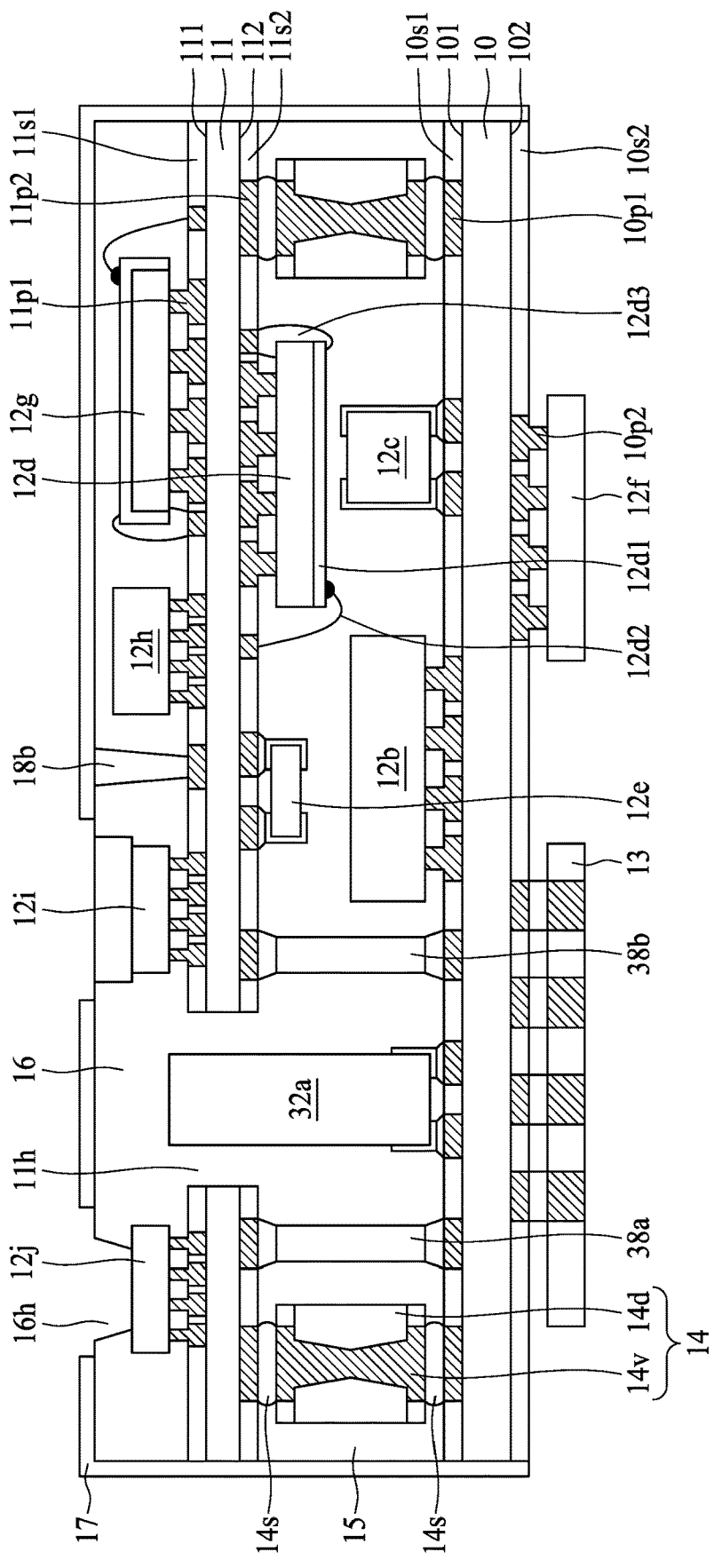
FIG. 3 is a cross-sectional view of a semiconductor device package in accordance with an embodiment of the present disclosure.

FIG. 3 illustrates a cross-sectional view of a semiconductor device package 3 in accordance with some embodiments of the present disclosure. The semiconductor device package 3 is similar to the semiconductor device package 1 as shown in FIG. 1A, and the differences therebetween are described below.

As shown in FIG. 3, the semiconductor device package 3 includes a relatively thicker (or taller) electronic component 32*a*. In some embodiments, a thickness the electronic component 32*a* is greater than a thickness of other electronic components disposed between the substrates 10 and 11 or a sum of the thicknesses of two electronic components (e.g., the electronic components 12*c* and 12*d*) disposed in a stacked arrangement between the substrates 10 and 11. To reduce the thickness of the semiconductor device package 3, the substrate 11 may include or define an opening 11*h* (or a hole) penetrating the substrate 11 to accommodate a portion of the electronic component 32*a*. For example, the electronic component 32*a* may extend within the opening 11*h* of the substrate 11.

Figure 4:
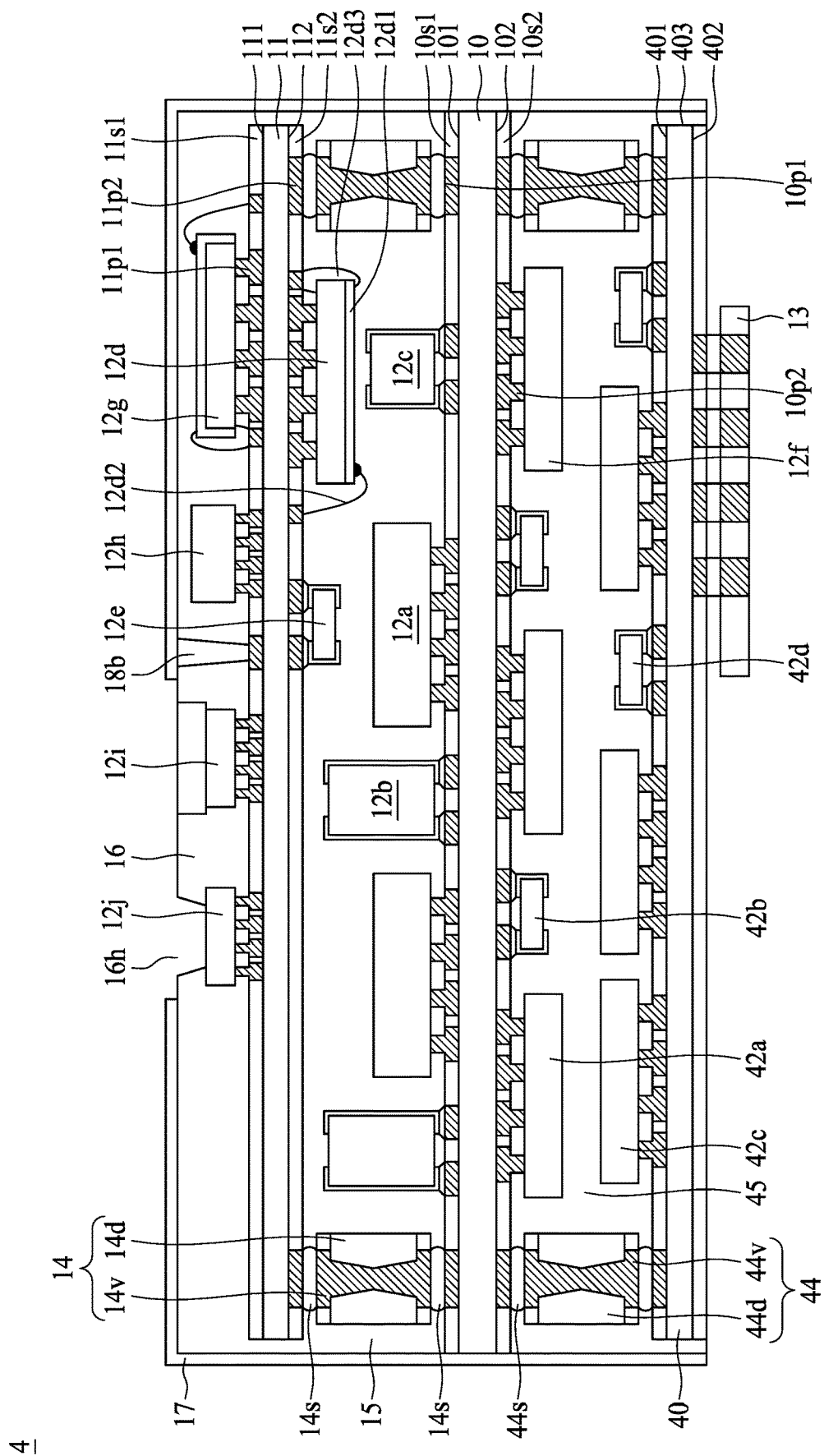
FIG. 4 is a cross-sectional view of a semiconductor device package in accordance with an embodiment of the present disclosure.

FIG. 4 illustrates a cross-sectional view of a semiconductor device package 4 in accordance with some embodiments of the present disclosure. The semiconductor device package 4 is similar to the semiconductor device package 2 as shown in FIG. 2, and some of the differences therebetween are described below.

The semiconductor device package 4 further includes a substrate 40 disposed over the surface 102 of the substrate 10. In some embodiments, the substrate 40 and the substrate 10 may include the same material. Alternatively, the substrate 40 and the substrate 10 may include different materials. The interposer 44 is disposed between the substrates 10 and 40, and electrically connected to the substrates 10 and 40. The interposer 44 may include a dielectric layer 44*d* and at least one via 44*v* penetrating the dielectric layer 44*d* for electrical connection. The exposed portions of the via 44*v* may be electrically connected to the substrate 10 and the substrate 40 through solder balls 44*s*. In some embodiments, there may be any number of the interposers 44 depending on different design specifications. The interposers 44 may be disposed in or near the periphery or any other locations of the substrate 10 or 40. By providing the substrate 40, the area of the semiconductor device package 4 can be further reduced.

The electronic components 42*a*, 42*b* are disposed on the surface 102 of the substrate 10 and electrically connected to the substrate 10. The electronic components 42*c*, 42*d* are disposed on the surface 401 of the substrate 40 and electrically connected to the substrate 40. The electronic components 42*a*, 42*b*, 42*c*, 42*d* may include active electrical components and/or passive electrical components. For example, the electronic components 42*a*, 42*c* may be chips or dice including a semiconductor substrate, one or more integrated circuit devices and one or more overlying interconnection structures therein. For example, the electronic components 42*b*, 42*d* may be passive electrical components, such as capacitors, resistors or inductors. The connector module 13 is disposed on the surface 402 of the substrate 40 and electrically connected to the substrate 40.

The package body 45 is disposed between the substrates 10 and 40 to cover or encapsulate the interposer 44 and the electronic components 42*a*, 42*b*, 42*c*, 42*d*. In some embodiments, the package body 45 includes an epoxy resin having fillers, a molding compound (e.g., an epoxy molding compound or other molding compound), a polyimide, a phenolic compound or material, a material with a silicone dispersed therein, or a combination thereof. Similar to the substrate 11, a lateral surface 403 of the substrate 40 may be recessed from a lateral surface of the package body 45. In other embodiments, the lateral surface 403 of the substrate 40 may be coplanar with the lateral surface of the package body 45.

Figure 5:
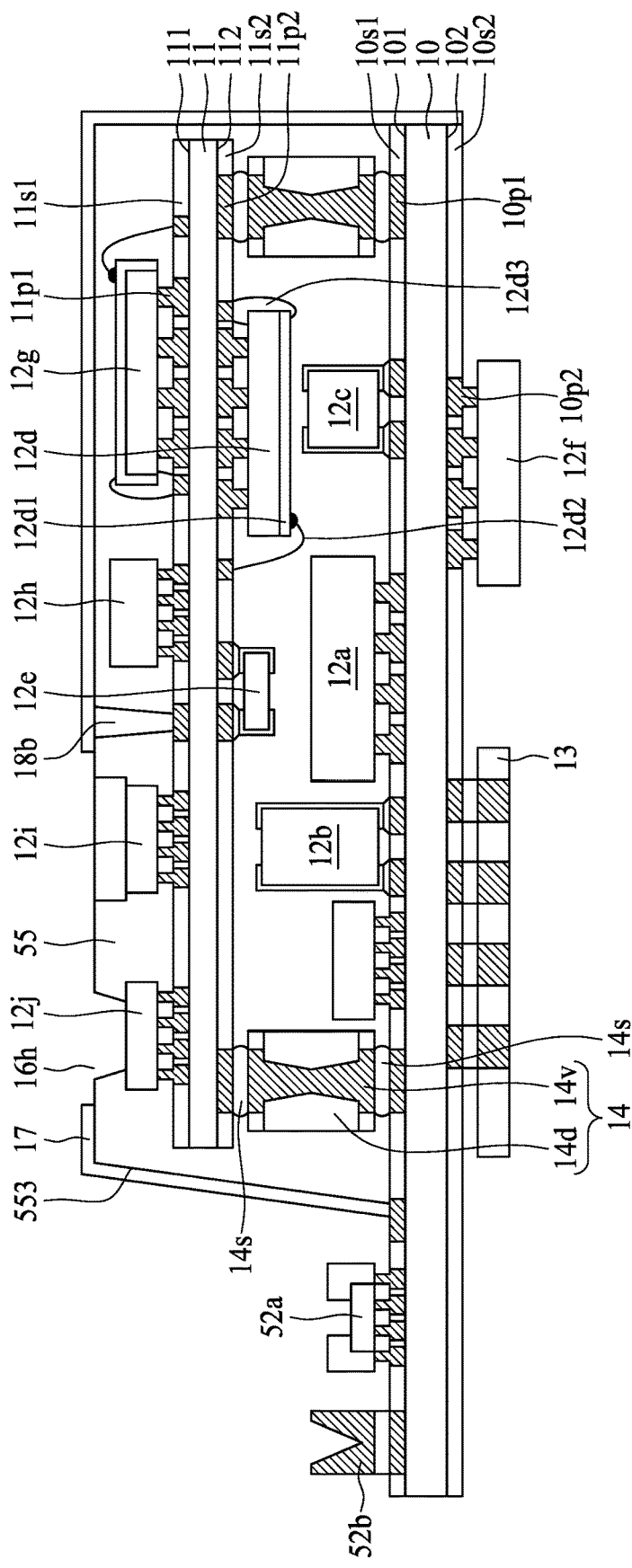
FIG. 5 is a cross-sectional view of a semiconductor device package in accordance with an embodiment of the present disclosure.

FIG. 5 illustrates a cross-sectional view of a semiconductor device package 5 in accordance with some embodiments of the present disclosure. The semiconductor device package 5 is similar to the semiconductor device package 2 as shown in FIG. 2, and the some of the differences therebetween are described below.

Figure 6:
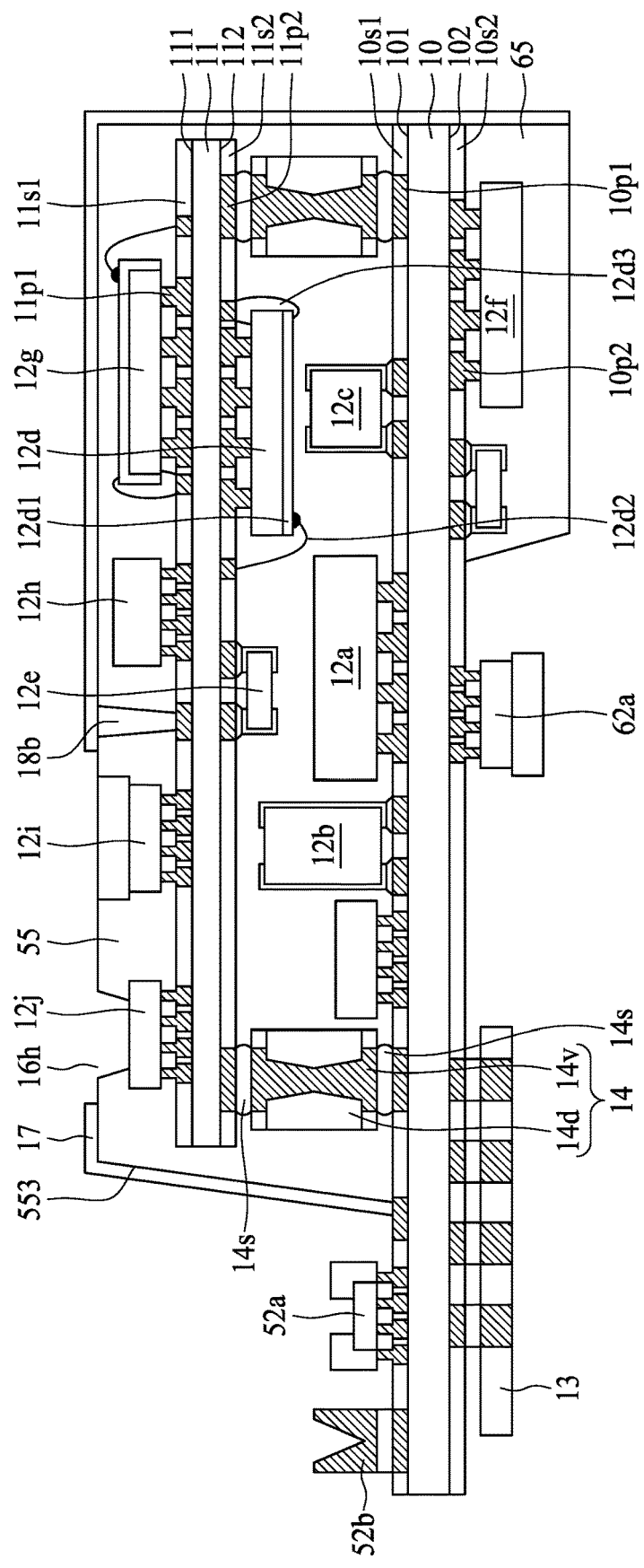
FIG. 6 is a cross-sectional view of a semiconductor device package in accordance with an embodiment of the present disclosure.

The surface 101 of the substrate 10 may include a first portion covered by a package body 55 and a second portion exposed from the package body 55. As shown in FIG. 6, the substrate 11, the electronic components 12*a*, 12*b*, 12*c*, 12*d*, 12*e*, 12*g*, 12*h*, 12*i*, 12*j*, 12*k*, the interposer 14, package body 55 and the shielding layer 17 are disposed over the first portion of the surface 101 of the substrate 10. Electronic components 52*a*, 52*b* are disposed on the second portion of the surface 101 of the substrate 10. For example, the electronic components 52*a* and 52*b* are not covered by the package body 55. In some embodiments, the electronic components 52*a* and 52*b* may be electrical devices required to be exposed to the outside of the semiconductor device package 5. For example, the electronic components 52*a* and 52*b* may be optical devices (e.g., light emitting devices or light detecting devices), sensors, MEMS, connector modules or other devices.

In some embodiments, the package body 55 includes an inclined or tilted lateral surface 553. For example, the lateral surface 553 of the package body 55 is not perpendicular to the surface 101 of the substrate 10. For example, the lateral surface 553 of the package body 55 and the surface 101 of the substrate 10 define an angle less than 90 degrees.

FIG. 6 illustrates a cross-sectional view of a semiconductor device package 6 in accordance with some embodiments of the present disclosure. The semiconductor device package 6 is similar to the semiconductor device package 5 as shown in FIG. 5, and the some of the differences therebetween are described below.

The semiconductor device package 6 further includes a package body 65 disposed on a portion of the surface 102 of the substrate 10. For example, the surface 102 of the substrate 10 may include a first portion covered by the package body 65 and a second portion exposed from the package body 65. The electronic component 12*f* may be disposed on the first portion of the surface 102 of the substrate 10 and covered by the package body 65. An electronic component 61*a* and the connector module 13 are disposed on the second portion of the surface 102 of the substrate 10. In some embodiments, the electronic component 62*a* may be an electrical device required to be exposed to the outside of the semiconductor device package 6. For example, the electronic components 62*a* may be an optical device (e.g., a light emitting device or a light detecting device), a sensor, MEMS, a connector module or other devices. In some embodiments, the package body 65 includes an epoxy resin having fillers, a molding compound (e.g., an epoxy molding compound or other molding compound), a polyimide, a phenolic compound or material, a material with a silicone dispersed therein, or a combination thereof.

Figure 7:
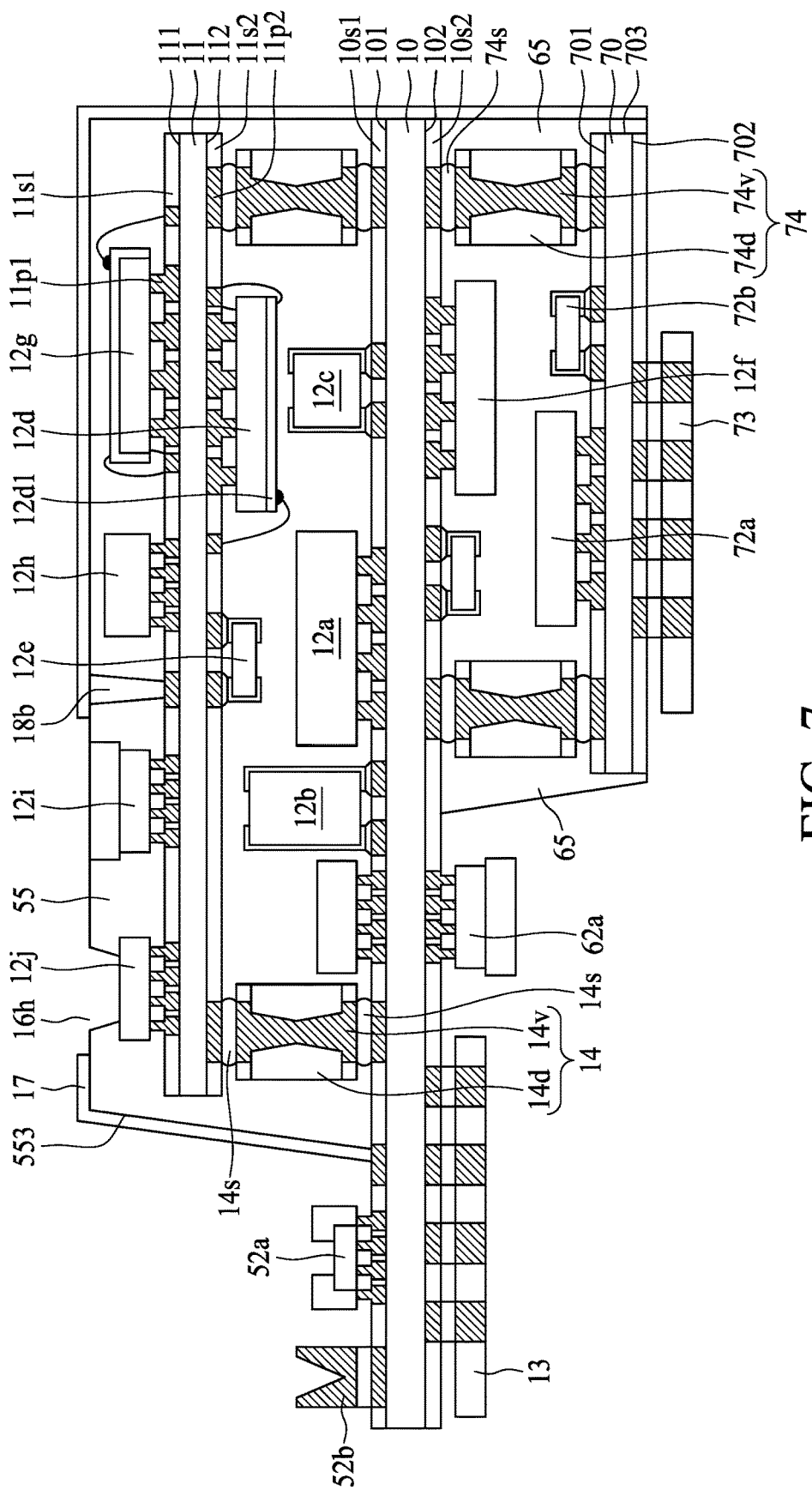
FIG. 7 is a cross-sectional view of a semiconductor device package in accordance with an embodiment of the present disclosure.

FIG. 7 illustrates a cross-sectional view of a semiconductor device package 7 in accordance with some embodiments of the present disclosure. The semiconductor device package 7 is similar to the semiconductor device package 6 as shown in FIG. 6, and some of the differences therebetween are described below.

The semiconductor device package 7 further includes a substrate 70 disposed over the surface 102 of the substrate 10. In some embodiments, the substrate 70 and the substrate 10 may include the same material. Alternatively, the substrate 70 and the substrate 10 may include different materials. The interposer 74 is disposed between the substrates 10 and 70, and electrically connected to the substrates 10 and 70. The interposer 74 may include a dielectric layer 74*d* and at least one via 74*v* penetrating the dielectric layer 74*d* for electrical connection. The exposed portions of the via 74*v* may be electrically connected to the substrate 10 and the substrate 70 through solder balls 74*s*. In some embodiments, there may be any number of the interposers 74 depending on different design specifications. The interposers 74 may be disposed in or near the periphery or any other locations of the substrate 10 or 70. By providing the substrate 70, the area of the semiconductor device package 7 can be further reduced.

The electronic components 72*a*, 72*b* are disposed on a surface 701 of the substrate 70 and electrically connected to the substrate 70. The electronic components 72*a*, 72*b* may include active electrical components and/or passive electrical components. For example, the electronic component 72*a* may be a chip or a die including a semiconductor substrate, one or more integrated circuit devices and one or more overlying interconnection structures therein. For example, the electronic component 72*b* may be a passive electrical component, such as a capacitor, a resistor or an inductor. A connector module 73 is disposed on a surface 702 of the substrate 70 and electrically connected to the substrate 70.

The package body 65 is disposed between the substrates 10 and 70 to cover or encapsulate the interposer 74 and the electronic components 12*f*, 72*a*, 72*b*. Similar to the substrate 11, a lateral surface 703 of the substrate 70 may be recessed from a lateral surface of the package body 65. In other embodiments, the lateral surface 703 of the substrate 70 may be coplanar with the lateral surface of the package body 65.

Figure 8:
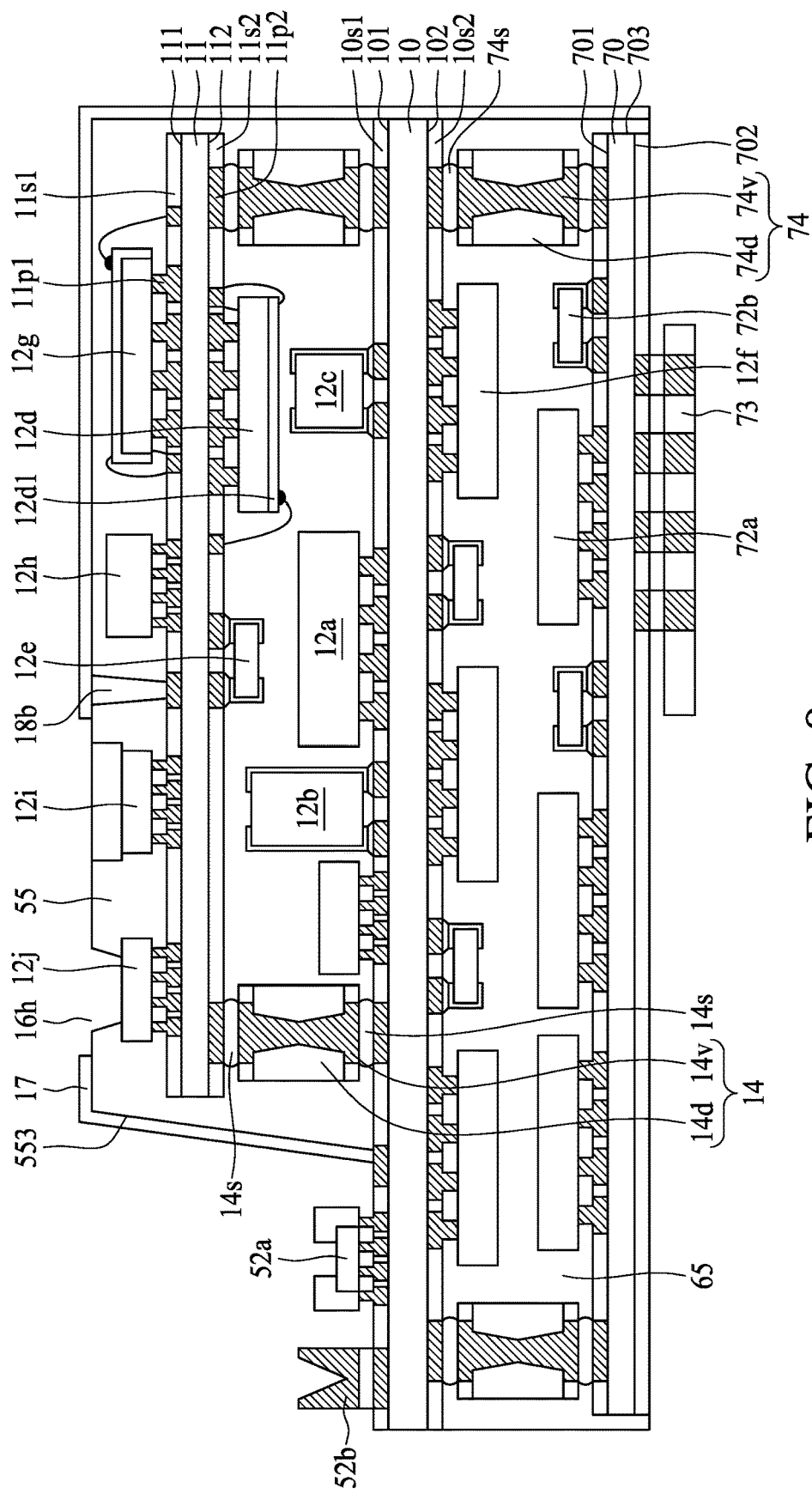
FIG. 8 is a cross-sectional view of a semiconductor device package in accordance with an embodiment of the present disclosure.

FIG. 8 illustrates a cross-sectional view of a semiconductor device package 8 in accordance with some embodiments of the present disclosure. The semiconductor device package 8 is similar to the semiconductor device package 7 as shown in FIG. 7, and one of the differences therebetween is that in FIG. 8, the package body 65 fully covers or encapsulates the surface 102 of the substrate 10.

Figure 9A:
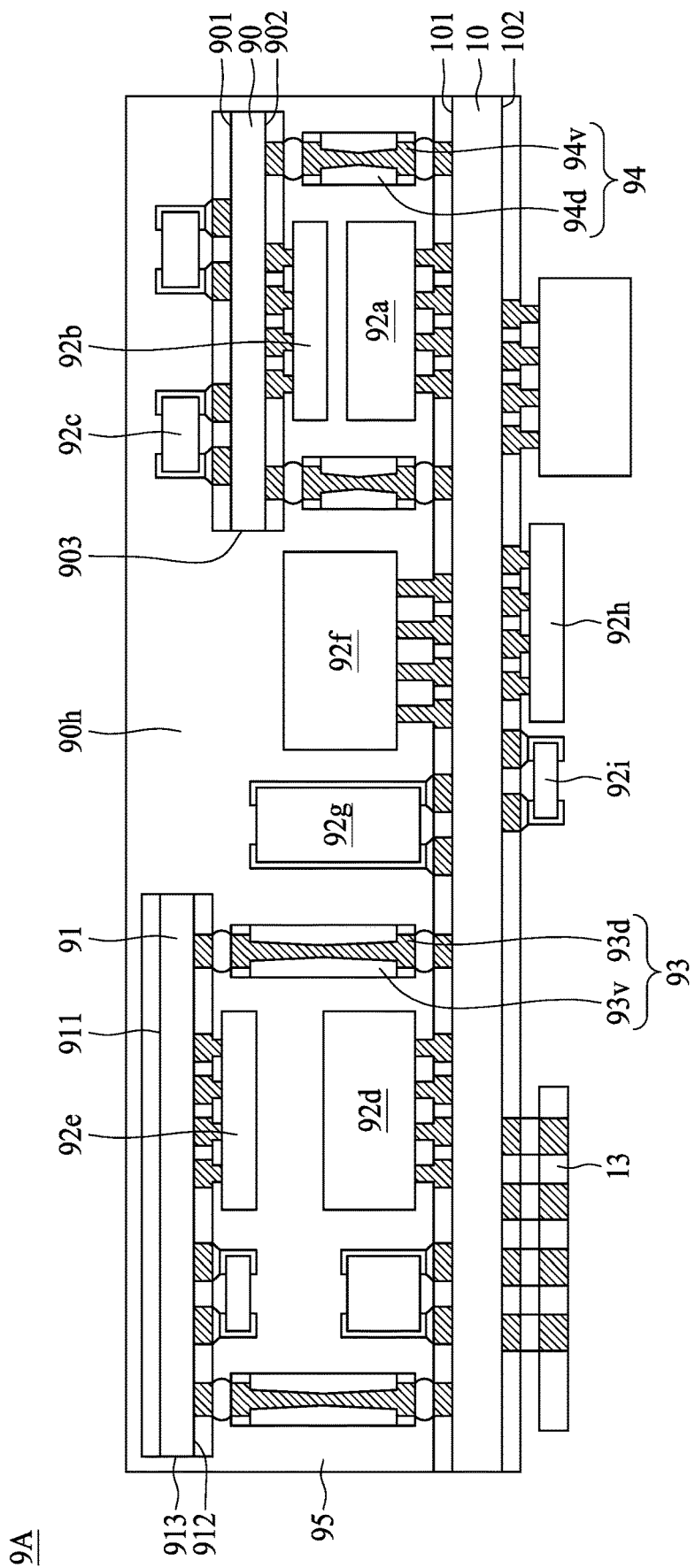
FIG. 9A is a cross-sectional view of a semiconductor device package in accordance with an embodiment of the present disclosure.

FIG. 9A illustrates a cross-sectional view of a semiconductor device package 9A in accordance with some embodiments of the present disclosure. The semiconductor device package 9A includes substrates 10, 91, 92, electronic components 92*a*, 92*b*, 92*c*, 92*d*, 92*e*, 92*f*, 92*g*, 92*h*, 92*i* a connector module 13, interposers 93, 94 and a package body 95.

The substrate 90 is disposed over the surface 101 of the substrate 10. The substrate 90 is similar to the substrate 10, and thus the descriptions or properties of the substrate 10 may be applicable to the substrate 90. In some embodiments, the substrate 90 and the substrate 10 may include the same material. Alternatively, the substrate 90 and the substrate 10 may include different materials.

The interposer 94 is disposed between the substrates 10 and 90, and electrically connected to the substrates 10 and 90. The interposer 94 may include a dielectric layer 94*d* and at least one via 94*v* penetrating the dielectric layer 94*d* for electrical connection. The exposed portions of the via 94*v* may be electrically connected to the substrate 10 and the substrate 90 through solder balls. In some embodiments, there may be any number of the interposers 94 depending on different design specifications. The interposers 94 may be disposed in or near the periphery or any other locations of the substrate 90.

The electronic component 92*a* is disposed on the surface 101 of the substrate 10 and electrically connected to the substrate 10. The electronic component 92*b* is disposed on the surface 902 of the substrate 90 and electrically connected to the substrate 90. The electronic components 92*a*, 92*b* may include active electrical components and/or passive electrical components. For example, the electronic components 92*a*, 92*b* may be chips or dice including a semiconductor substrate, one or more integrated circuit devices and one or more overlying interconnection structures therein. In other embodiments, the electronic components 92*a*, 92*b* may be passive electrical components, such as capacitors, resistors or inductors.

The electronic component 92*a* and the electronic component 92*b* are at least partially overlapping in a direction perpendicular to the surface 101 of the substrate 10. For example, a projection of the electronic component 92*a* on the surface 101 of the substrate 10 and a projection of the electronic component 92*b* on the surface 101 of the substrate 10 are at least partially overlapping. In some embodiments, the electronic component 92*a* may be a relatively thicker electronic component, while the electronic component 92*b* may be a relatively thinner electronic component, and vice versa. By arranging one electronic component having a relatively thinner thickness over another electronic component having a relatively thicker thickness, the thickness of the semiconductor device package 9A can be reduced.

The electronic component 92*c* is disposed on the surface 901 of the substrate 90 and electrically connected to the substrate 90. The electronic component 92*c* may include an active electrical component and/or a passive electrical component. For example, the electronic component 92*c* may be a passive electrical component, such as a capacitor, a resistor or an inductor. In other embodiments, the electronic component 92*c* may be a chip or a die including a semiconductor substrate, one or more integrated circuit devices and one or more overlying interconnection structures therein.

The substrate 91 is disposed over the surface 101 of the substrate 10 and spaced apart from the substrate 90. For example, there is a distance between the substrate 90 and the substrate 91. For example, the substrate 90 and the substrate 91 may define a recess 90*h*. In some embodiments, the substrate 90 and the substrate 91 are separate (or individual) substrates. The substrate 91 is similar to the substrate 10, and thus the descriptions or properties of the substrate 10 may be applicable to the substrate 91. In some embodiments, the substrate 91 and the substrate 10 may include the same material. Alternatively, the substrate 91 and the substrate 10 may include different materials.

The interposer 93 is disposed between the substrates 10 and 91, and electrically connected to the substrates 10 and 91. The interposer 93 may include a dielectric layer 93*d* and at least one via 93*v* penetrating the dielectric layer 93*d* for electrical connection. The exposed portions of the via 93*v* may be electrically connected to the substrate 10 and the substrate 91 through solder balls. In some embodiments, there may be any number of the interposers 93 depending on different design specifications. The interposers 93 may be disposed in or near the periphery or any other locations of the substrate 91.

The electronic component 92*d* is disposed on the surface 101 of the substrate 10 and electrically connected to the substrate 10. The electronic component 92e is disposed on the surface 912 of the substrate 91 and electrically connected to the substrate 91. The electronic components 92d, 92e may include active electrical components and/or passive electrical components. For example, the electronic components 92d, 92e may be chips or dice including a semiconductor substrate, one or more integrated circuit devices and one or more overlying interconnection structures therein. In other embodiments, the electronic components 92d, 92e may be passive electrical components, such as capacitors, resistors or inductors.

The electronic component 92d and the electronic component 92e are at least partially overlapping in a direction perpendicular to the surface 101 of the substrate 10. For example, a projection of the electronic component 92d on the surface 101 of the substrate 10 and a projection of the electronic component 92e on the surface 101 of the substrate 10 are at least partially overlapping. In some embodiments, the electronic component 92e may be a relatively thinner electronic component, while the electronic component 92d may be a relatively thicker electronic component, and vice versa. By arranging one electronic component having a relatively thinner thickness over another electronic component having a relatively thicker thickness, the thickness of the semiconductor device package 9A can be reduced.

The electronic components 92f and 92g are disposed on the surface 101 of the substrate 10 and electrically connected to the substrate 10. In some embodiments, the electronic components 92f and 92g are disposed under the recess 90h defined by the substrates 10 and 11. For example, a projection of the electronic components 92f and 92g on the surface 101 of the substrate and a projection of the substrate 90 or the substrate 91 are not overlapping. For example, the electronic components 92f and 92g and the substrate 90 or the substrate 91 are not overlapping in a direction perpendicular to the surface 101 of the substrate 10. In other embodiments, the substrate 90 or the substrate 91 may extend over a portion of the electronic components 92f and 92g. By arranging electronic components (e.g., the electronic components 92f and 92g) having a relatively thicker thickness under the recess 90h defined by two separate substrates (e.g., the substrates 90 and 91), the thickness of the semiconductor device package 9A can be further reduced.

In some embodiments, the electronic components 92f and 92g may include active electrical components and/or passive electrical components. For example, the electronic component 92f may be a chip or a die including a semiconductor substrate, one or more integrated circuit devices and one or more overlying interconnection structures therein. The electronic component 92g may be a passive electrical component, such as a capacitor, a resistor or an inductor.

In some embodiments, the substrate 90 and the substrate 91 may be arranged at different altitudes with respect to the substrate 10 (e.g., a distance between the surface 912 of the substrate 91 and the surface 101 of the substrate 10 is different from a distance between the surface 902 of the substrate 90 and the surface 101 of the substrate 10) depending on the total thickness of the electronic components accommodate under the substrate 90 and the substrate 91. For example, if the total thickness of the electronic components 92d and 92e is greater than the total thickness of the electronic components 92a and 92b, the distance between the surface 912 of the substrate 91 and the surface 101 of the substrate 10 would be greater than the distance between the surface 902 of the substrate 90 and the surface 101 of the substrate 10. This would increase the flexibility for designing the arrangement of the electronic components of the semiconductor device package 9A to save the area and the thickness of the semiconductor device package 9A. In addition, by disposing the electronic components 92c on the substrate 90, which has a relatively lower altitude, the area and the thickness of the semiconductor device package 9A can be further reduced.

In some embodiments, the semiconductor device package 9A may include several electronic components having a relatively thickness (e.g., the electronic components 92a and 92d). The electronic components having a relatively thickness can be disposed at different regions. For example, the electronic component 92a is disposed at the region between the substrate 10 and the substrate 90, and the electronic component 92d is disposed at another region between the substrate 10 and the substrate 91. This can further reduce the thickness of the semiconductor device package 9A.

Figure 9B:
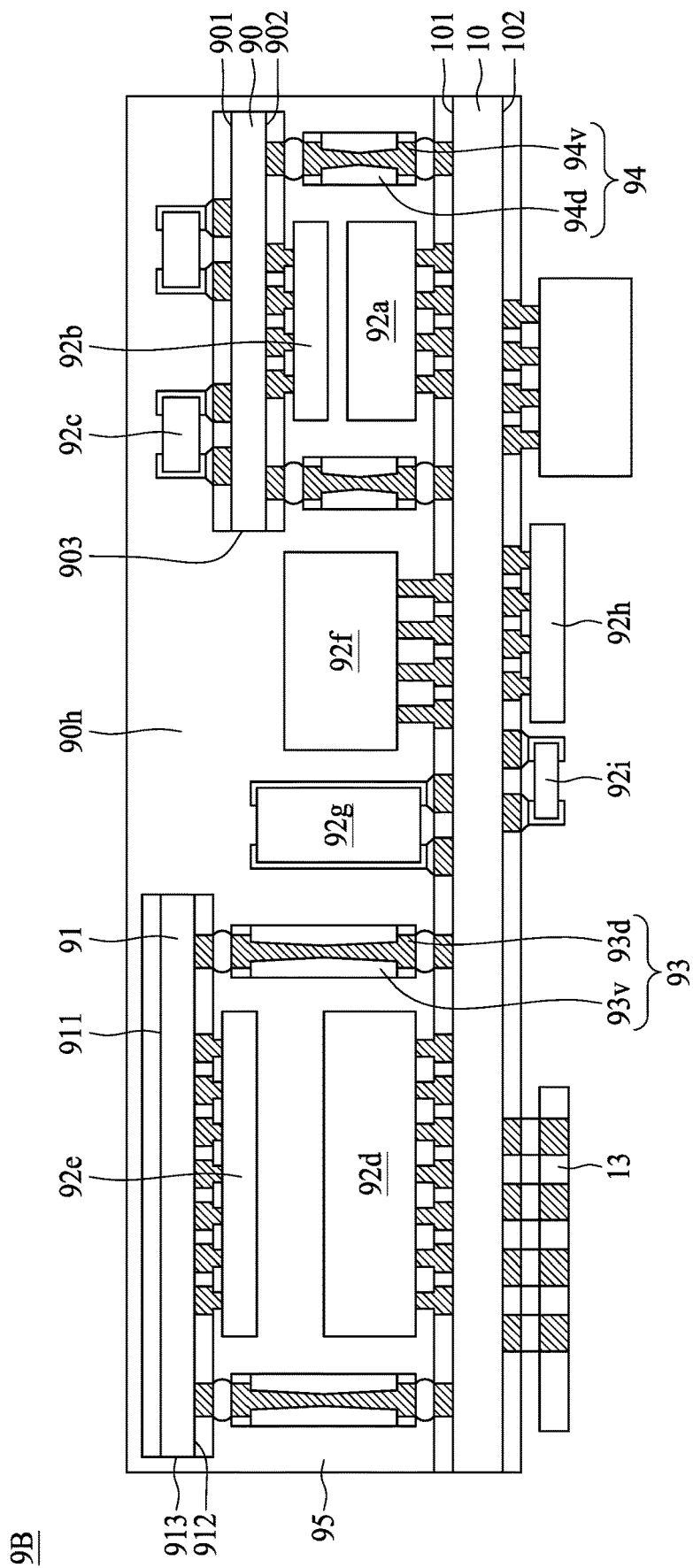
FIG. 9B is a cross-sectional view of a semiconductor device package in accordance with an embodiment of the present disclosure.

In some embodiments, the electronic components can be arranged based on their widths (or areas) to further reduce the area of the semiconductor device package. For example, as shown in FIG. 9B, the electronic components 92d and 92e, which have a relatively larger width (or area) compared with the electronic components 92a and 92b can be arranged at the same space or region (e.g., the space defined by the substrate 10 and the substrate 91). Hence, the area of the semiconductor device package 9B can be reduced.

Figure 9C:
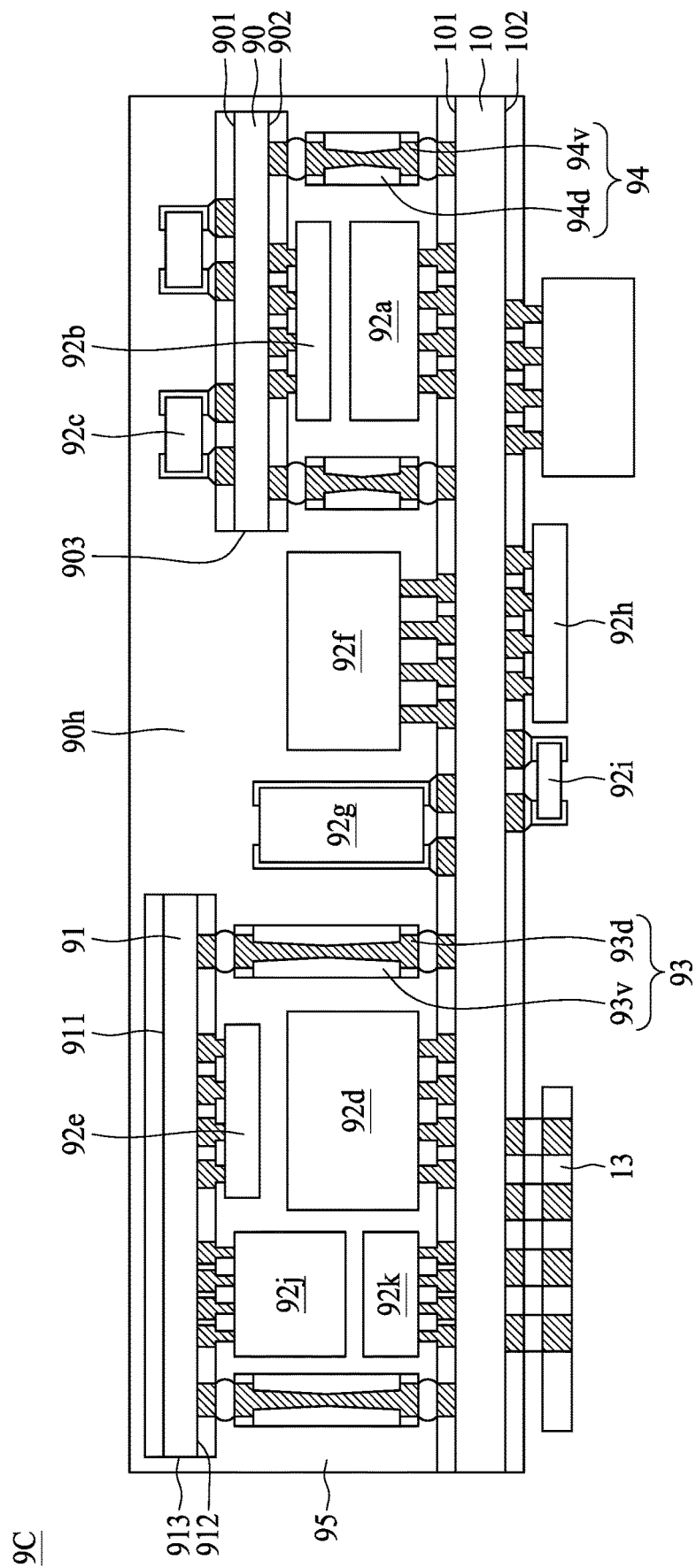
FIG. 9C is a cross-sectional view of a semiconductor device package in accordance with an embodiment of the present disclosure.

In some embodiments, the electronic components can be arranged based on their thicknesses to further reduce the thickness of the semiconductor device package. For example, as shown in FIG. 9C, the semiconductor device package 9C includes a plurality of electronic components 92d, 92e, 92j and 92k disposed at the space or region defined by the substrate 10 and the substrate 91. To efficiently utilize the height defined by the substrate 10 and the substrate 91, one electronic component having a relatively thicker thickness and another electronic component having a relatively thinner thickness are disposed overlappingly in a direction perpendicular to the surface 101 of the substrate 10. For example, the electronic component 92e having a relatively thinner thickness and the electronic component 92d having a relatively thicker thickness are overlapping in the direction perpendicular to the surface 101 of the substrate 10. For example, the electronic component 92k having a relatively thinner thickness and the electronic component 92j having a relatively thicker thickness are overlapping in the direction perpendicular to the surface 101 of the substrate 10. Hence, the thickness of the semiconductor device package 9C can be reduced.

Figure 9D:
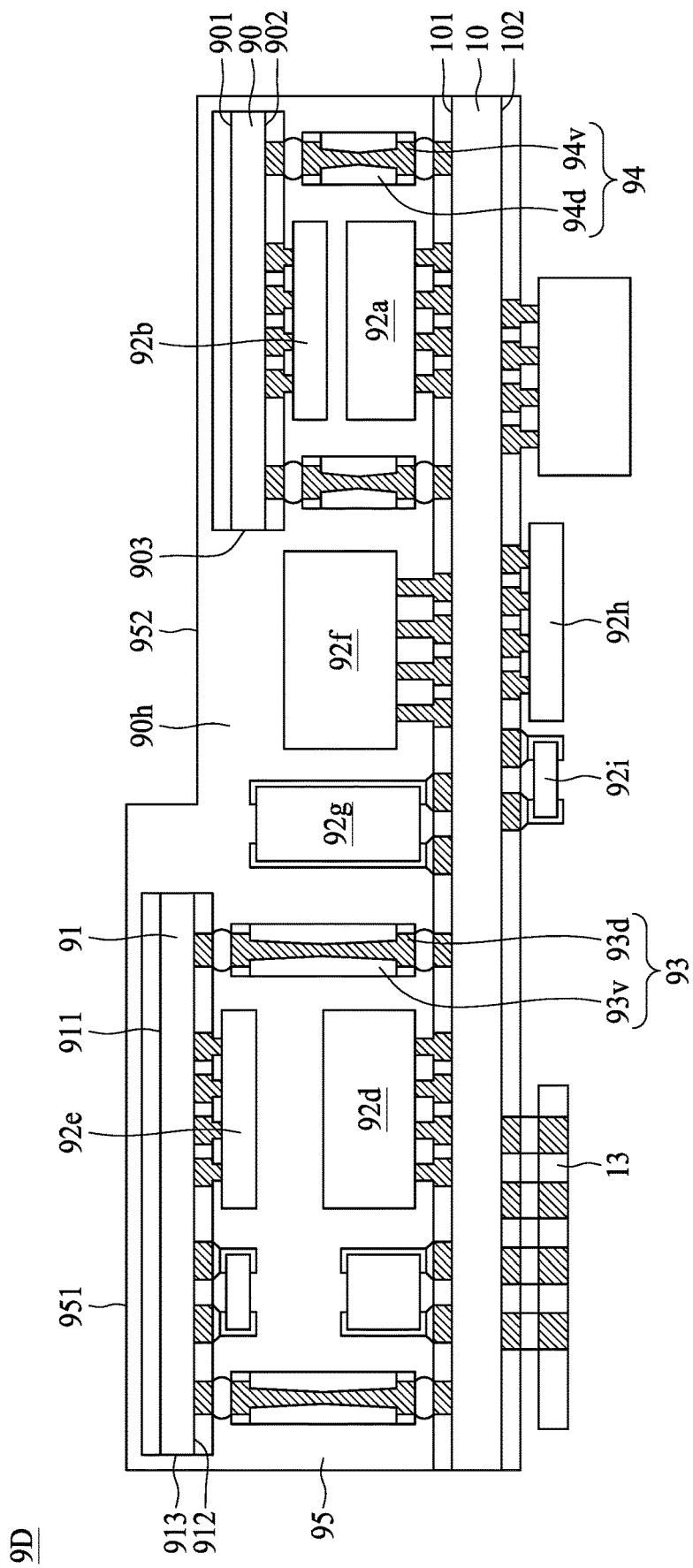
FIG. 9D is a cross-sectional view of a semiconductor device package in accordance with an embodiment of the present disclosure.

FIG. 9D illustrates a cross-sectional view of a semiconductor device package 9D in accordance with some embodiments of the present disclosure. The semiconductor device package 9D is similar to the semiconductor device package 9A as shown in FIG. 9A, and the differences therebetween are described below.

A top surface of the package body 95 may include a recess or a step structure. For example, the package body 95 may include a top surface 951 and a top surface 952, and the top surface 951 and the top surface 952 are discontinuous or non-coplanar. For example, the top surface 952 is recessed from the top surface 951. In the case that the electronic component 92c is not required, the thickness of the package body 95 over the substrate 90 can be reduced to accommodate other external elements or device to further reduce the area or thickness of an electrical device including the semiconductor device package 9D.

Figure 10C:
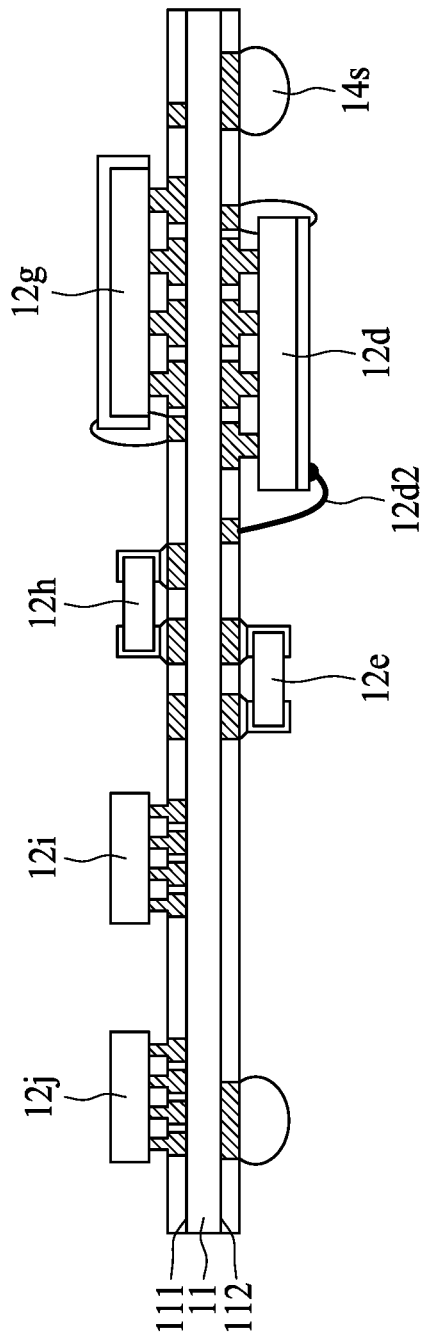
Figure 10D:
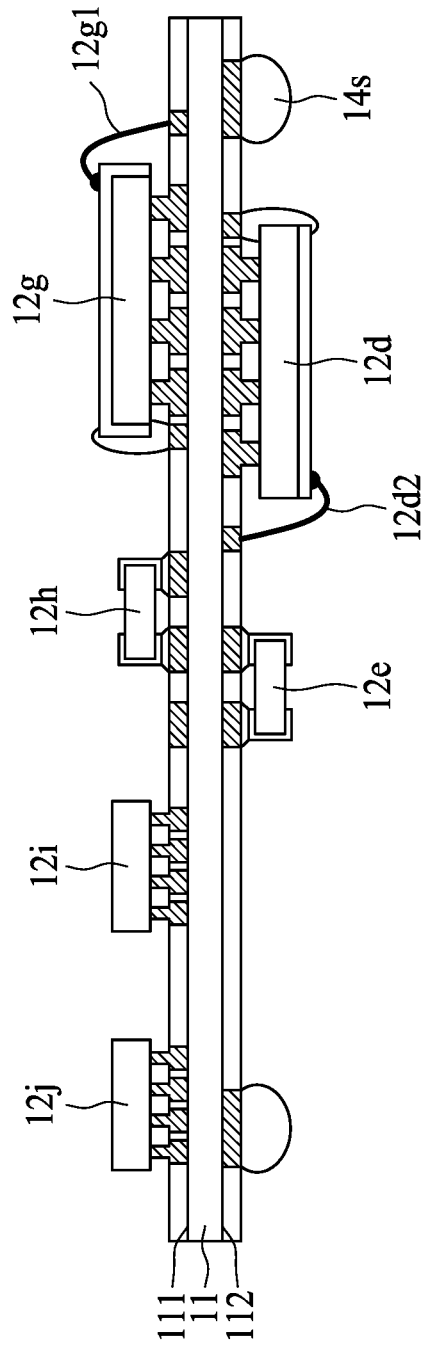
Figure 10E:
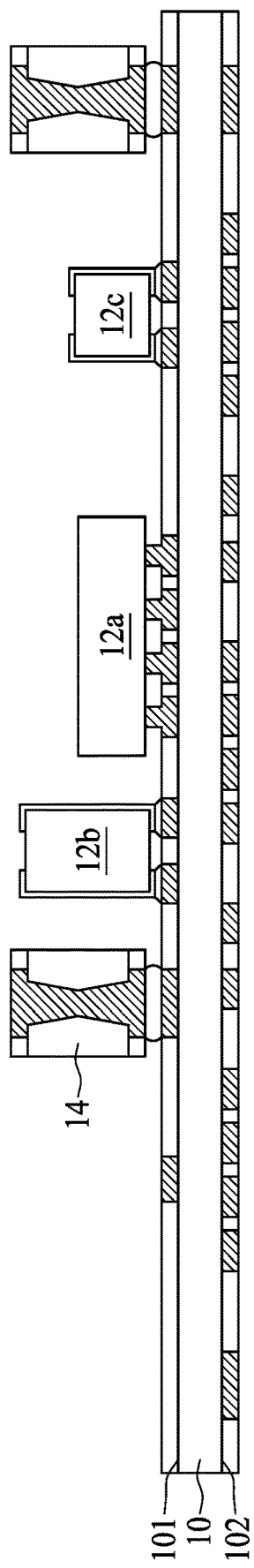
Figure 10F:
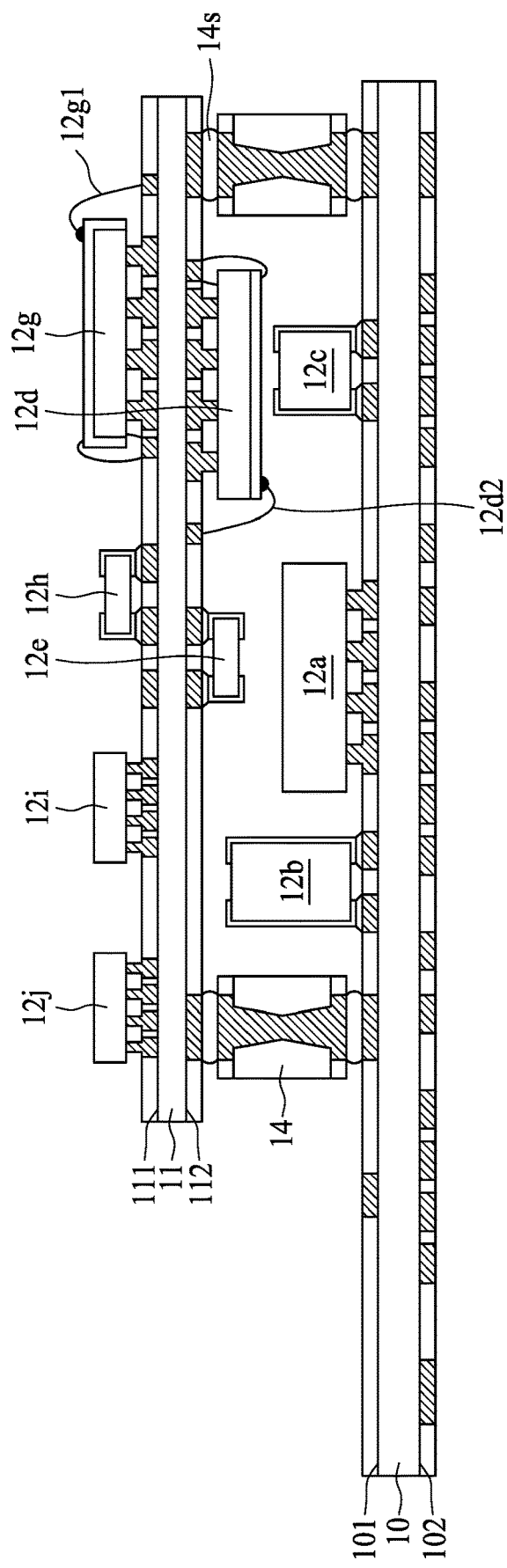
Figure 10G:
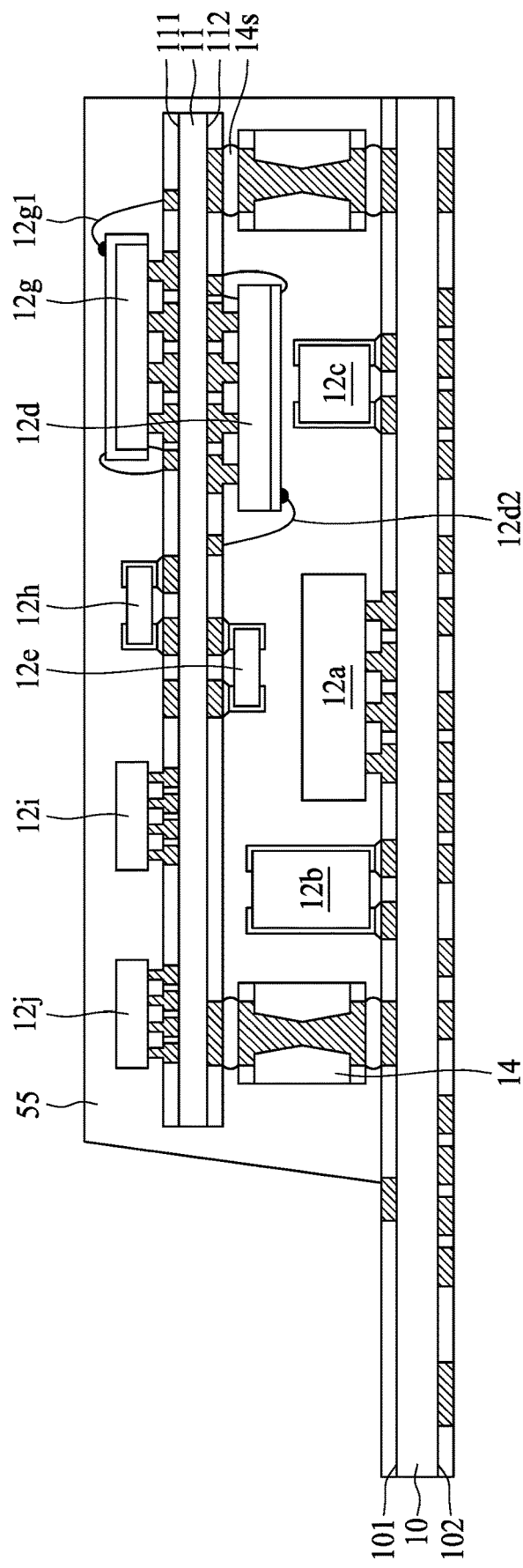
Figure 10H:
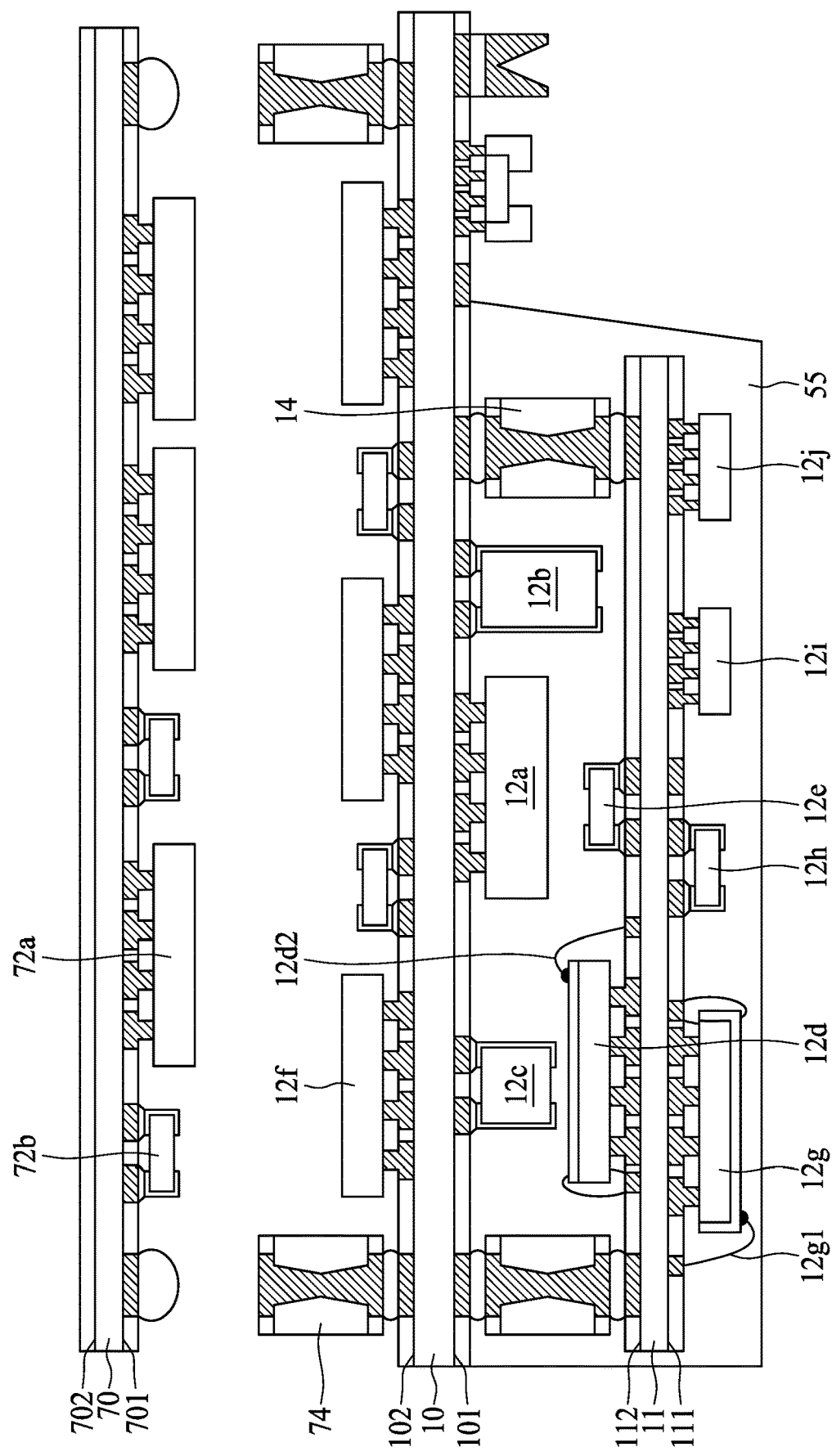
Figure 10I:
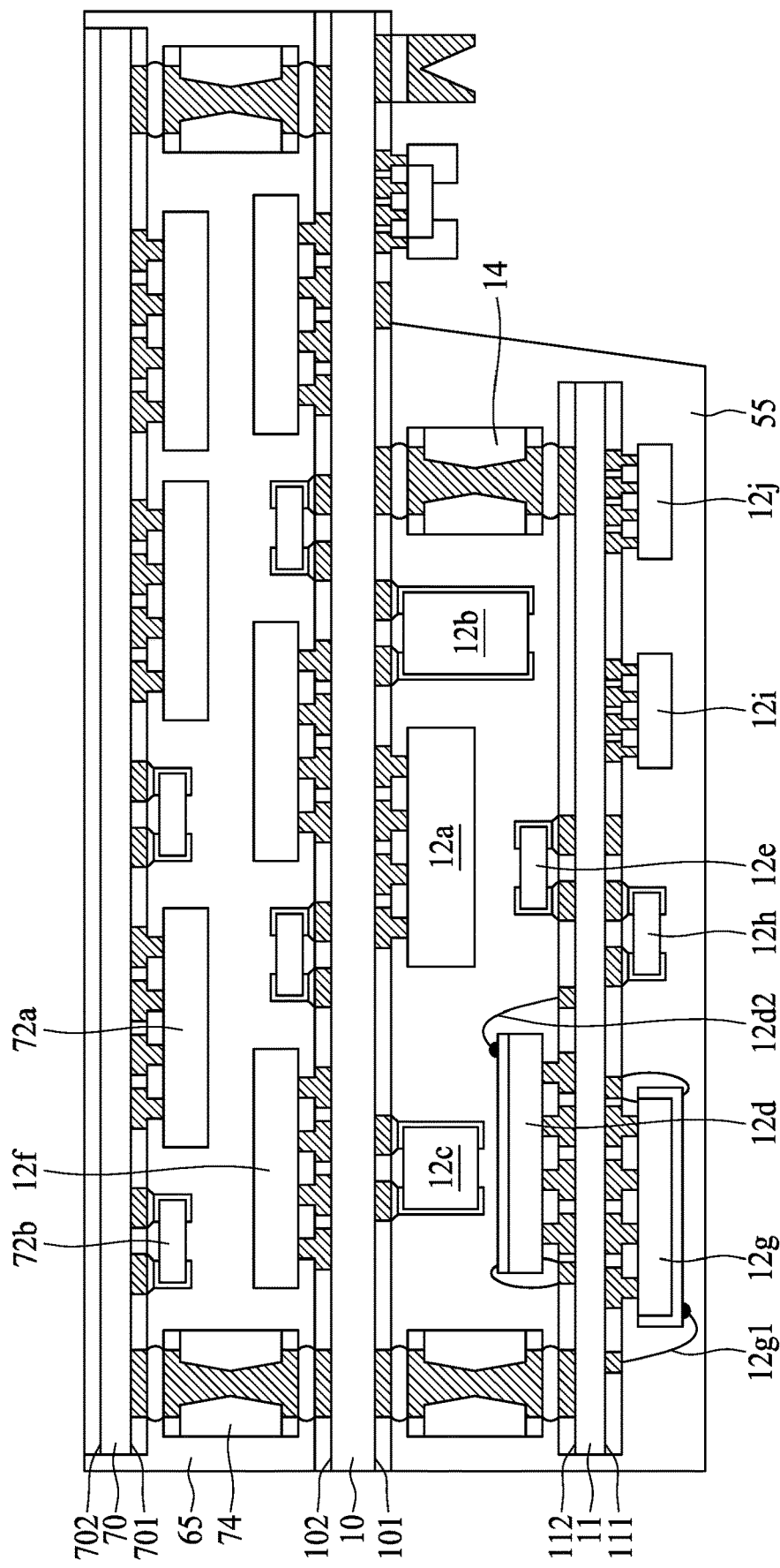
Figure 10J:
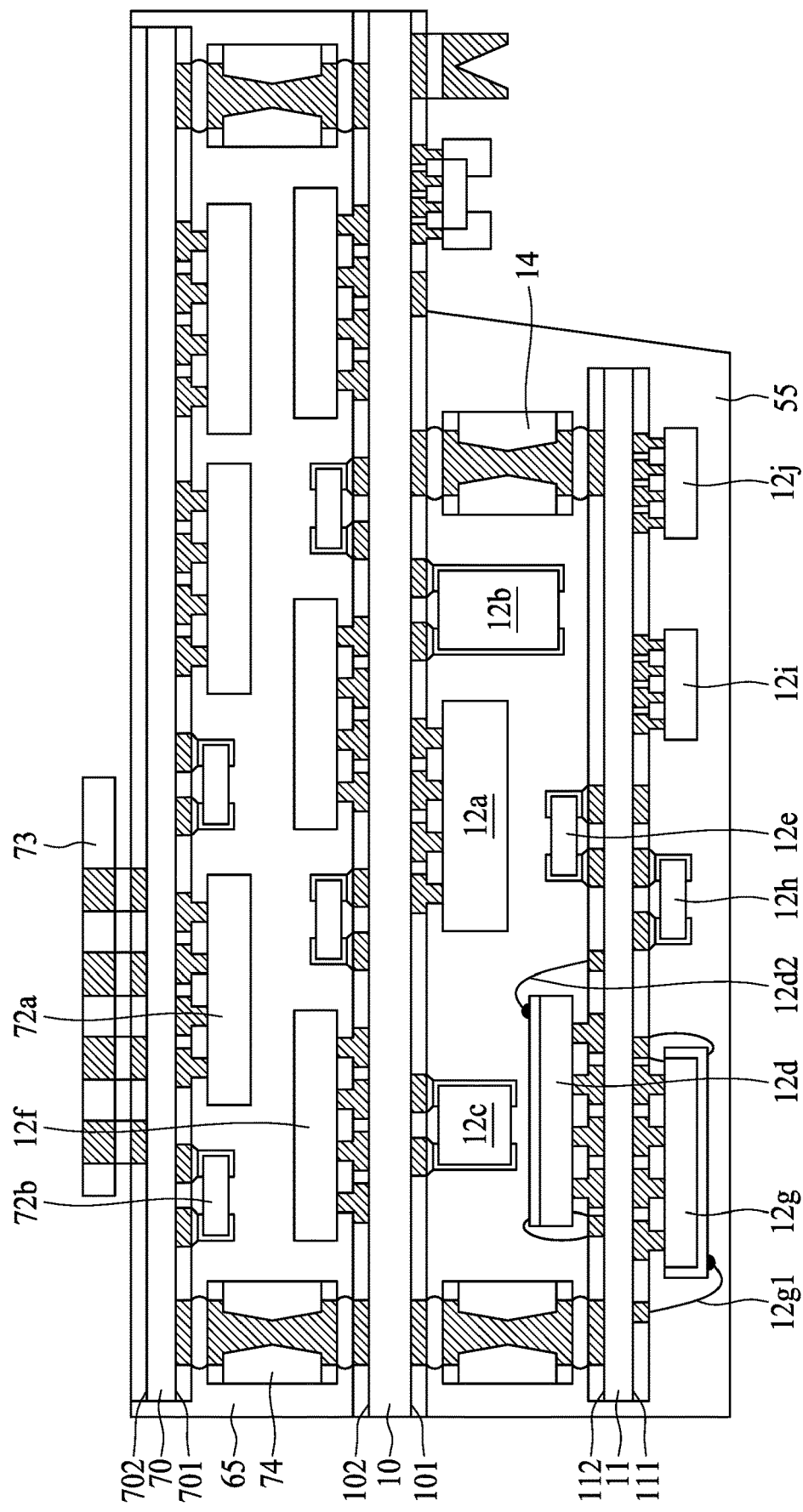
Figure 10K:
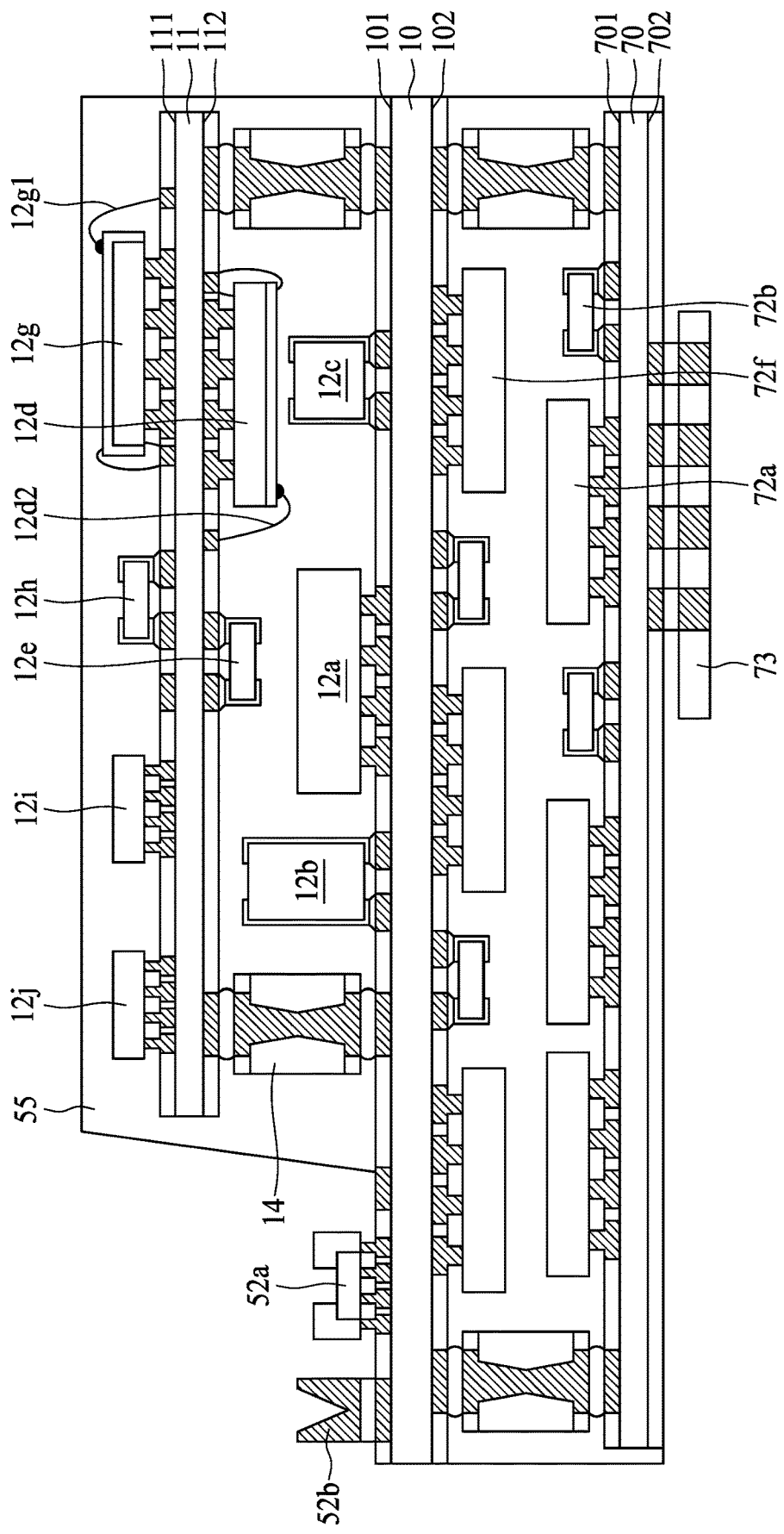
Figure 10L:
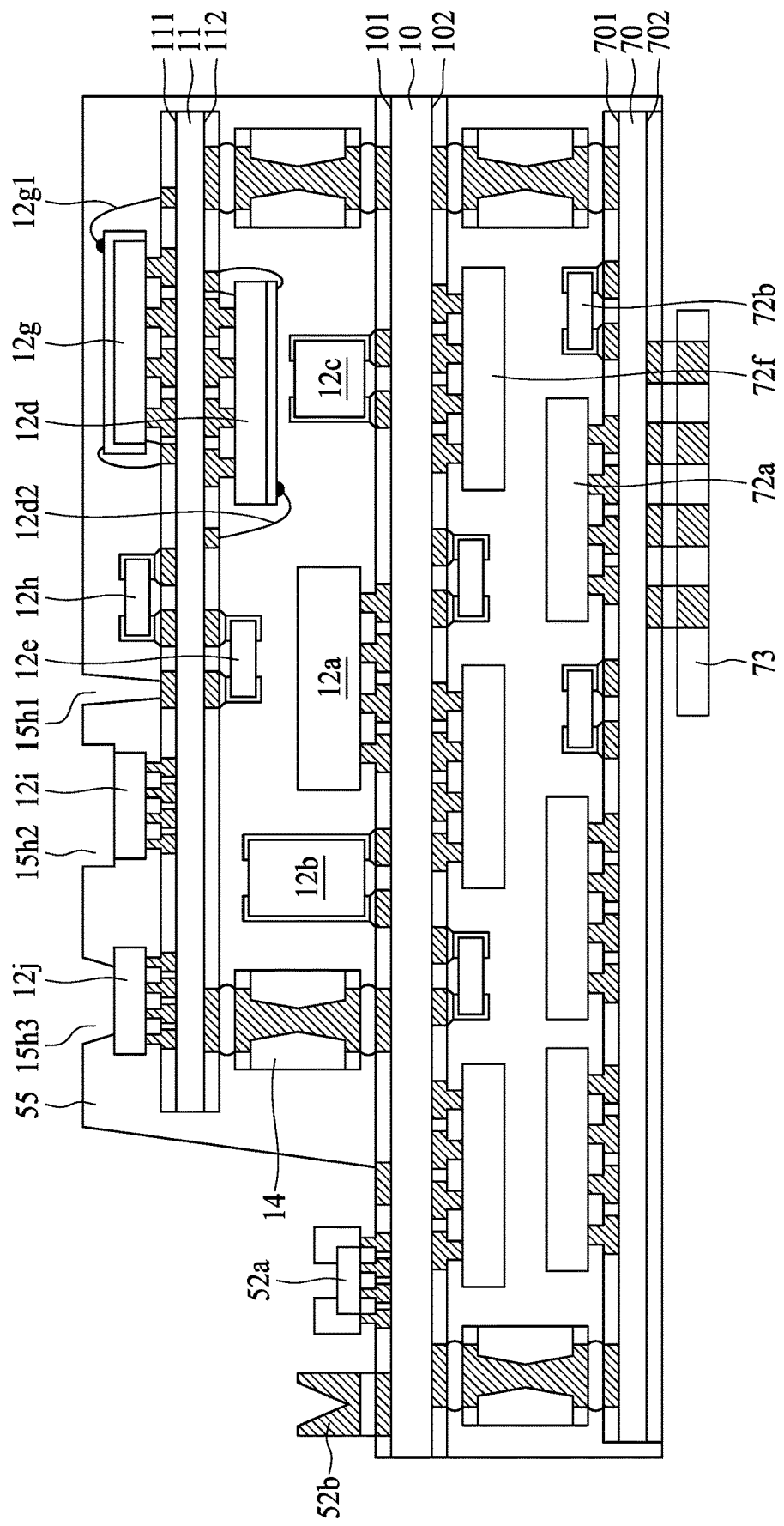
Figure 10M:
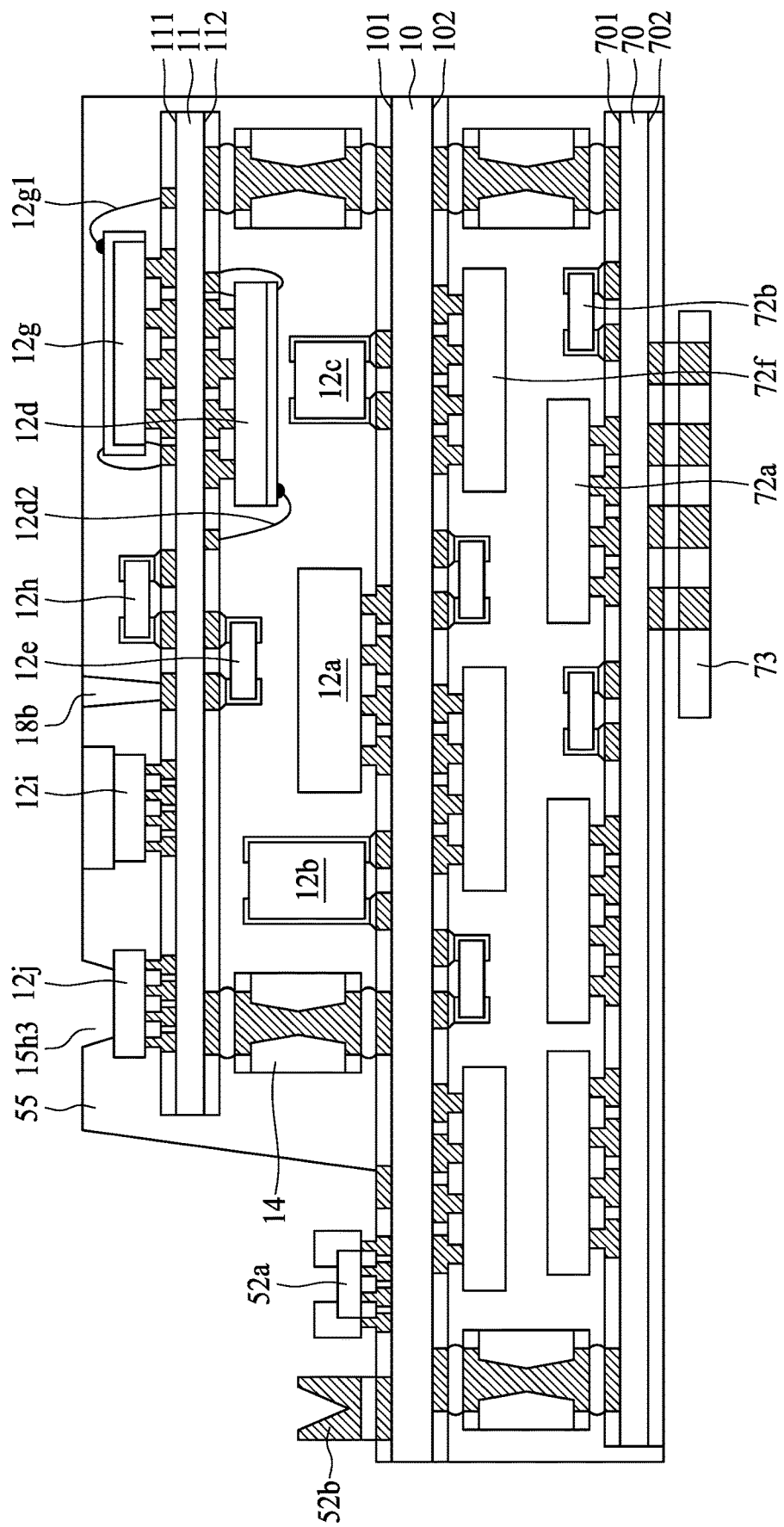
Figure 10N:
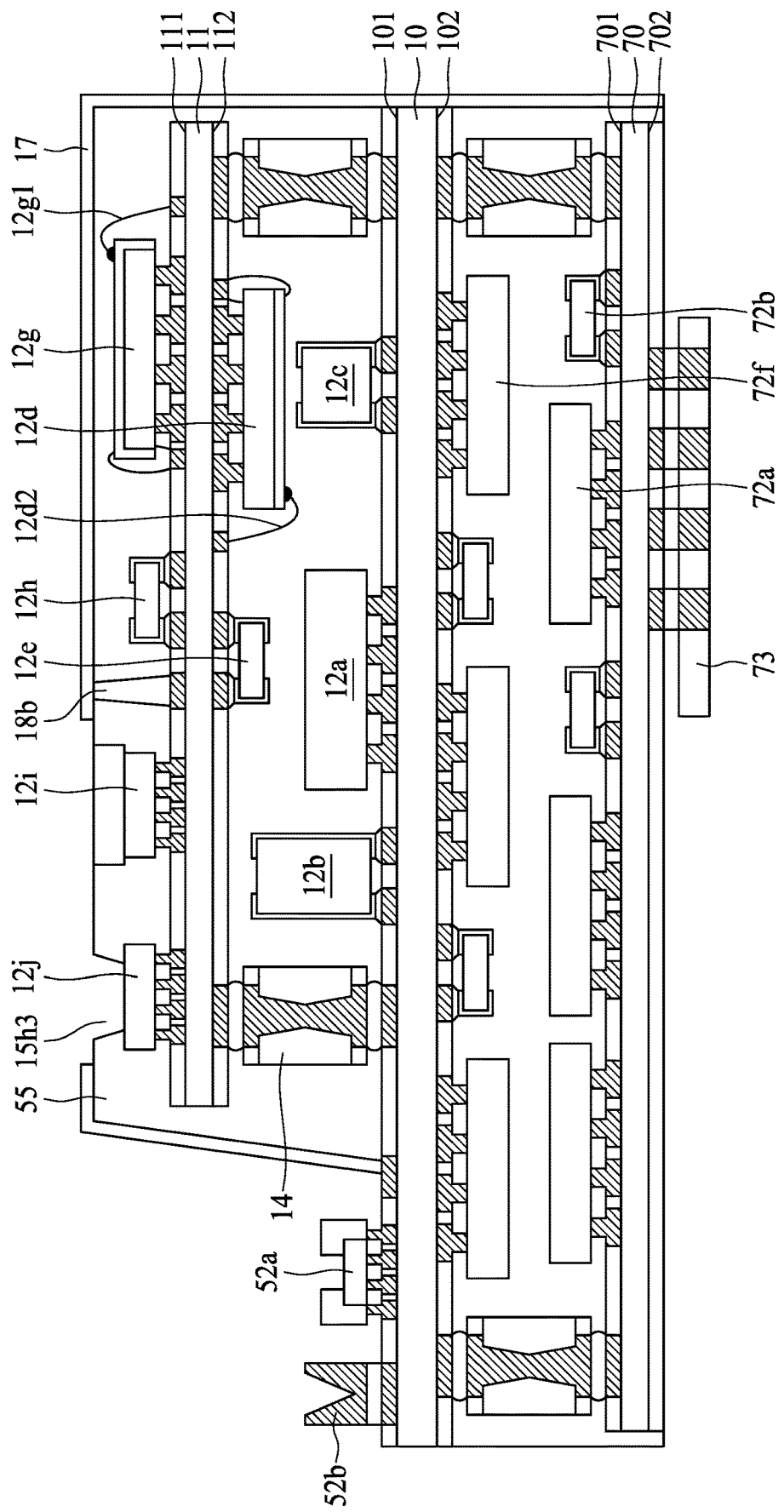

FIG. 10A, FIG. 10B, FIG. 10C, FIG. 10D, FIG. 10E, FIG. 10F, FIG. 10G, FIG. 10H, FIG. 10I, FIG. 10J, FIG. 10K,

FIG. 10L, FIG. 10M and FIG. 10N illustrate a semiconductor manufacturing method in accordance with some embodiments of the present disclosure. In some embodiments, the method in FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, FIG. 10M and FIG. 10N can be used to manufacture the semiconductor device package 8 in FIG. 8. Alternatively, the method in FIG. 10A, FIG. 10B, FIG. 10C, FIG. 10D, FIG. 10E, FIG. 10F, FIG. 10G, FIG. 10H, FIG. 10I, FIG. 10J, FIG. 10K, FIG. 10L, FIG. 10M and FIG. 10N can be used to manufacture the semiconductor device package in FIG. 1A, 2, 3, 4, 5, 6, 7, 9A, 9B, 9C or 9D or other semiconductor device packages.

Referring to FIG. 10A, the substrate 11 is provided. Electronic components 12e and 12d are disposed on the surface 112 of the substrate 11 by, for example, surface mount technique (SMT) or any other suitable techniques. The electronic components 12e and 12d are electrically connected to the substrate 11 through, for example, flip-chip, wire bonding or any other suitable techniques. One or more electrical contacts (e.g., solder balls 14s) are then disposed on the surface 112 of the substrate 11 and electrically connected to the conductive pads of the substrate 11.

In some embodiments, the electronic component 12d may include a shielding layer disposed on the backside surface of the electronic component 12d and connected to ground of the substrate 11 through a bonding wire 12d2 as shown in FIG. 10B. In other embodiments, the shielding layer may be connected to ground of the substrate through a conductive paste, a conductive glue or any other suitable materials.

Referring to FIG. 10C, electronic components 12g, 12h, 12i and 12j are disposed on the surface 111 of the substrate 11 by, for example, SMT or any other suitable processes. The electronic components 12g, 12h, 12i and 12j are electrically connected to the substrate 11 through, for example, flip-chip, wire bonding or any other suitable techniques. In some embodiments, the electronic component 12g may include a shielding layer disposed on the backside surface of the electronic component 12g and connected to ground of the substrate 11 through a bonding wire 12g1 as shown in FIG. 10D.

Referring to FIG. 10E, the substrate 10 is provided. Electronic components 12a, 12b and 12c are disposed on the surface 101 of the substrate 10 and electrically connected to the substrate 10 through, for example, flip-chip, wire bonding or any other suitable techniques. The interposer 14 is disposed on the surface 101 of the substrate 10 and electrically connected to the substrate 10. In some embodiments, the operations in FIG. 10E may be carried out prior to the operations in FIG. 10A.

Referring to FIG. 10F, the substrate 10 is connected to the substrate 11. For example, the interposer 14 disposed on the surface 101 of the substrate 10 is connected to the solder balls 14s. In some embodiments, a width (or an area) of the substrate 10 is less than a width (or an area) of the substrate 11. Alternatively, the width of the substrate 10 is equal to or greater than the width of the substrate 11.

Referring to FIG. 10G, the package body 55 is formed to cover the electronic components 12a, 12b, 12c, 12d, 12e, 12i, 12j, 12g, 12h, the substrate 10 (including the surfaces 101, 102 and a lateral surface extending therebetween), the interposer 14 and a portion of the substrate 11. For example, the package body 55 covers a first portion of the surface 101 of the substrate 10 on which the substrate 11 is disposed and exposes a second portion of the surface 102 of the substrate 10. In some embodiments, the package body 55 may be formed by selective molding technique or any other suitable techniques.

Referring to FIG. 10H, electronic components 12f are disposed on the surface 102 of the substrate 10 and electrically connected to the substrate 10 through, for example, flip-chip, wire bonding or any other suitable techniques. The interposer 74 is disposed on the surface 102 of the substrate 10 and electrically connected to the substrate 10.

Still referring to FIG. 10H, the substrate 70 on which one or more electronic components and the solder balls are disposed is provided. The substrate 70 is then connected to the substrate 10. For example, the solder balls disposed on the surface 701 of the substrate 70 is connected to the interposer 74 disposed on the surface 102 of the substrate 10.

Referring to FIG. 10I, the package body 65 is formed between the substrate 10 and the substrate 70 to cover the electronic components and the interposer 74 disposed therebetween. In some embodiments, the package body 65 may be formed by, for example, molding or any other suitable processes.

Referring to FIG. 10J, the connector module 73 is disposed on the surface 702 of the substrate 70. In some embodiments, the connector module 73 may be disposed by, for example, SMT or any other suitable techniques.

Referring to FIG. 10K, electronic components 52a and 52b are disposed on the second portion of the surface 101 of the substrate 10 that is exposed from the package body 55. In some embodiments, the electronic components 52a and 52b may be disposed by, for example, SMT or any other suitable techniques.

Referring to FIG. 10L, one or more openings 15h1, 15h2, 15h3 (or trenches) are formed from a top surface of the package body 55 into the package body 55 to penetrate the package body 55 to expose one or more conductive pads on the surface 111 of the substrate 11 and at least portion of the electronic components 12i, 12j. In some embodiments, the openings 15h1, 15h2, 15h3 may be formed by, laser, etching or any other suitable operations.

Referring to FIG. 10M, a conductive material is filled within the opening 15h1 to form the compartment shield 18b. In some embodiments, the conductive material may be formed by plating, coating or any other suitable processes. Then a singulation operation may be carried out to separate out individual semiconductor package devices.

Referring to FIG. 10N, the shielding layer 17 is formed on the external surfaces (e.g., a portion of the top surface and the lateral surfaces) of the package body 55 and a portion of the lateral surface of the package body 65. In some embodiments, the shielding layer 17 may be formed by plating, coating, sputtering or any other suitable processes.

Reference to the formation or positioning of a first feature over or on a second feature in the present disclosure may include embodiments in which the first and second features are formed or disposed in direct contact, and may also include embodiments in which additional features may be formed or disposed between the first and second features, such that the first and second features may not be in direct contact.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

For example, substantially parallel can refer to a range of angular variation relative to 0° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, substantially perpendicular can refer to a range of angular variation relative to 90° of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a first substrate having a first surface;
   a second substrate disposed over the first surface of the first substrate;
   a first active electrical component disposed between the first substrate and the second substrate;
   a second active electrical component disposed between the first substrate and the second substrate and closer to the second substrate than the first active electrical component is, wherein the first active electrical component and the second active electrical component are at least partially overlapped in a direction substantially perpendicular to the first surface of the first substrate; and
   a passive component disposed between the first active electrical component and an interposer, wherein a distance between the passive component and the interposer is greater than a distance between the passive component and the first active electrical component.

2. The semiconductor device package of claim 1, wherein a width of the first active electrical component is greater than a width of the second active electrical component.

3. The semiconductor device package of claim 2, further comprising a first electronic component disposed on the first substrate and not between the first substrate and second substrate, wherein a width of the first electronic component is greater than a width of the first active electrical component.

4. The semiconductor device package of claim 1, wherein in a cross-section view the second active electrical component is within a projection of the first active electrical component.

5. The semiconductor device package of claim 1, further comprising a first electronic component disposed on the first substrate, wherein the first electronic component is overlapped with the first active electrical component in a direction substantially perpendicular to the first surface of the first substrate.

6. The semiconductor device package of claim 5, wherein the first electronic component comprises an overlapped portion and a non-overlapped portion with the first active electrical component in a direction substantially perpendicular to the first surface of the first substrate, wherein a width of the overlapped portion is greater than a width of the non-overlapped portion.

7. The semiconductor device package of claim 1, further comprising a passive component disposed on the first substrate, wherein the passive component is not overlapped with the second active electrical component in a direction substantially perpendicular to the first surface of the first substrate.

8. The semiconductor device package of claim 7, further comprising a first electronic component disposed on the first substrate, wherein the first electronic component is overlapped with the passive component and the second active electrical component in a direction substantially perpendicular to the first surface of the first substrate.

9. The semiconductor device package of claim 8, wherein a gap between the passive component and the first active electrical component is overlapped with the first electronic component in a direction substantially perpendicular to the first surface of the first substrate.

10. The semiconductor device package of claim 9, wherein in a cross-section view the passive component is within a projection of the first electronic component.

11. A semiconductor device package, comprising:
    a first carrier having a first surface and a second surface opposite to the first surface;
    a first electronic component disposed on the first surface of the first carrier;

a first encapsulant encapsulating the first electronic component;

a second carrier disposed over and facing the second surface of the first carrier;

a plurality of second electronic components disposed between the first carrier and the second carrier, wherein the first encapsulant exposes a portion of the second carrier and wherein a first side surface of the first carrier is retracted from a first side surface of the second carrier; and a passive component disposed on the second carrier, wherein one of the plurality of the second electronic components is disposed on the second carrier and an upper surface of the passive component is higher than an upper surface of the second electronic component disposed on the second carrier.

12. The semiconductor device package of claim 11, wherein the first encapsulant further encapsulates the first side surface of the first carrier.

13. The semiconductor device package of claim 11, wherein a second side surface of the first carrier is retracted from a second side surface of the second carrier and the second side surface of the first carrier is opposite to the first side surface of the first carrier.

14. The semiconductor device package of claim 11, further comprising a passive component disposed on the second carrier, wherein a horizontal distance between an interposer disposed between the first carrier and the second carrier and the first side surface of the first carrier is smaller than a distance between the interposer and the passive component.

15. The semiconductor device package of claim 11, wherein one of the plurality of the second electronic components is disposed on the first carrier and the passive component is overlapped with the second electronic component disposed on the first carrier in a direction substantially parallel to the first surface of the first carrier.

16. A semiconductor device package, comprising:

a first substrate having a first surface;

a second substrate disposed over the first surface of the first substrate;

a first active electrical component disposed between the first substrate and the second substrate;

a second active electrical component disposed between the first substrate and the second substrate and closer to the second substrate than the first active electrical component is;

a first electronic component disposed on the second substrate;

a first package body disposed on the second substrate, wherein the first package body covers the first electronic component; and a passive component disposed on the second substrate, wherein a portion of the passive component is within a projection area of the first active electrical component in a direction substantially perpendicular to the first surface of the first substrate and a portion of the passive component is outside the project area.

17. The semiconductor device package of claim 16, wherein the first electronic component comprises an overlapped portion and a non-overlapped portion with the second active electrical component in a direction substantially perpendicular to the first surface of the first substrate, wherein a width of the overlapped portion is greater than a width of the non-overlapped portion.

* * * * *